United States Patent
Koezuka et al.

(10) Patent No.: US 9,748,399 B2
(45) Date of Patent: Aug. 29, 2017

(54) SEMICONDUCTOR DEVICE AND DISPLAY DEVICE COMPRISING AN OXIDE SEMICONDUCTOR CHANNEL REGION HAVING A DIFFERENT CRYSTAL ORIENTATION THAN SOURCE/DRAIN REGIONS

(71) Applicants: Junichi Koezuka, Tochigi (JP);
Kenichi Okazaki, Tochigi (JP);
Masahiro Takahashi, Atsugi (JP);
Takuya Matsuo, Osaka (JP); Shigeyasu Mori, Osaka (JP); Yosuke Kanzaki, Osaka (JP); Hiroshi Matsukizono, Osaka (JP)

(72) Inventors: Junichi Koezuka, Tochigi (JP);
Kenichi Okazaki, Tochigi (JP);
Masahiro Takahashi, Atsugi (JP);
Takuya Matsuo, Osaka (JP); Shigeyasu Mori, Osaka (JP); Yosuke Kanzaki, Osaka (JP); Hiroshi Matsukizono, Osaka (JP)

(73) Assignees: Semiconductor Energy Laboratory Co., Ltd., Atsugi-shi, Kanagawa-ken (JP); Sharp Kabushiki Kaisha, Osaka-shi, Osaka (JP)

( * ) Notice: Subject to any disclaimer, the term of this patent is extended or adjusted under 35 U.S.C. 154(b) by 0 days.

(21) Appl. No.: 14/246,493

(22) Filed: Apr. 7, 2014

(65) Prior Publication Data
US 2014/0306220 A1 Oct. 16, 2014

(30) Foreign Application Priority Data

Apr. 11, 2013 (JP) ................. 2013-083132

(51) Int. Cl.
*H01L 29/786* (2006.01)
*H01L 29/04* (2006.01)
(Continued)

(52) U.S. Cl.
CPC .......... *H01L 29/7869* (2013.01); *H01L 29/04* (2013.01); *H01L 29/045* (2013.01);
(Continued)

(58) Field of Classification Search
CPC ... H01L 27/1225; H01L 29/04; H01L 29/045; H01L 29/66969; H01L 29/78618; H01L 29/7869; H01L 29/78696
See application file for complete search history.

(56) References Cited

U.S. PATENT DOCUMENTS 5,731,856 A  3/1998 Kim et al.
5,744,864 A  4/1998 Cillessen et al.
(Continued)

FOREIGN PATENT DOCUMENTS

EP  1737044 A  12/2006
EP  2226847 A  9/2010
(Continued)

OTHER PUBLICATIONS

Asakuma.N et al., "Crystallization and Reduction of Sol-Gel-Derived Zinc Oxide Films by Irradition With Ultraviolet Lamp", Journal of Sol-Gel Science and Technology, 2003, vol. 26, pp. 181-184.
(Continued)

*Primary Examiner* — Tom Thomas
*Assistant Examiner* — Christopher M Roland
(74) *Attorney, Agent, or Firm* — Eric J. Robinson; Robinson Intellectual Property Law Office, P.C.

(57) ABSTRACT

To provide a novel semiconductor device in which a reduction in channel length is controlled. The semiconductor
(Continued)

device includes an oxide semiconductor layer having a crystal part, and a source electrode layer and a drain electrode layer which are in contact with the oxide semiconductor layer. The oxide semiconductor layer includes a channel formation region and an n-type region in contact with the source electrode layer or the drain electrode layer. The crystal orientation of the crystal part is different between the channel formation region and the n-type region.

9 Claims, 8 Drawing Sheets

(51) Int. Cl.
 H01L 29/66 (2006.01)
 H01L 27/12 (2006.01)
(52) U.S. Cl.
 CPC .. *H01L 29/66969* (2013.01); *H01L 29/78618* (2013.01); *H01L 29/78696* (2013.01); *H01L 27/1225* (2013.01)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,957,418 B2 | 2/2015 | Moriguchi et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0117076 A1* | 5/2010 | Akimoto ........... H01L 29/66969 257/43 |
| 2011/0062432 A1 | 3/2011 | Yamazaki et al. |
| 2011/0062436 A1 | 3/2011 | Yamazaki et al. |
| 2011/0068335 A1* | 3/2011 | Yamazaki ........... H01L 27/1225 257/43 |
| 2011/0127579 A1* | 6/2011 | Yamazaki ......... H01L 21/02472 257/192 |
| 2011/0128275 A1* | 6/2011 | Ueda .................... H01L 29/7869 345/212 |
| 2011/0240991 A1* | 10/2011 | Yamazaki ........... H01L 29/7831 257/43 |
| 2012/0052624 A1* | 3/2012 | Yamazaki ........... H01L 29/4908 438/104 |
| 2012/0118726 A1* | 5/2012 | Yano ....................... C04B 35/01 204/192.25 |
| 2012/0256179 A1 | 10/2012 | Yamazaki et al. |
| 2012/0280223 A1* | 11/2012 | Kim .................... H01L 29/7869 257/43 |
| 2013/0043475 A1* | 2/2013 | Kim .................. H01L 29/78633 257/59 |
| 2014/0035478 A1* | 2/2014 | Kitakado ............ H01L 29/7869 315/210 |

FOREIGN PATENT DOCUMENTS

| | | |
|---|---|---|
| EP | 2544237 A | 1/2013 |
| JP | 60-198861 A | 10/1985 |
| JP | 63-210022 A | 8/1988 |
| JP | 63-210023 A | 8/1988 |
| JP | 63-210024 A | 8/1988 |

(56) References Cited

FOREIGN PATENT DOCUMENTS

| JP | 63-215519 A | 9/1988 |
|---|---|---|
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| JP | 2011-086923 A | 4/2011 |
| JP | 2011-086927 A | 4/2011 |
| WO | WO-2004/114391 | 12/2004 |
| WO | WO-2011/033911 | 3/2011 |
| WO | WO-2011/033936 | 3/2011 |
| WO | WO-2012/077682 | 6/2012 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDS", Journal of the SID, 2008, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States"SID Digest '08 : SID International Symposium Digest of Technical Paper, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advances Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "SPINEL,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Room Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

(56) References Cited

OTHER PUBLICATIONS

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "Suftla Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", JPN. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B). Mar. 1, 2003, vol. 21, No. 2, pp. 800-803.

Park.J et al., "Electronic Transport Properties of Amorphous Indium-Gallium-Zinc Oxide Semicondictor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al.,"Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-17570

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

SEMICONDUCTOR DEVICE AND DISPLAY DEVICE COMPRISING AN OXIDE SEMICONDUCTOR CHANNEL REGION HAVING A DIFFERENT CRYSTAL ORIENTATION THAN SOURCE/DRAIN REGIONS

BACKGROUND OF THE INVENTION

1. Field of the Invention

The present invention relates to a semiconductor device and a display device. Note that in this specification, a semiconductor device refers to a semiconductor element itself or a device including a semiconductor element. Examples of such a semiconductor element include a transistor (e.g., a thin film transistor). Furthermore, a display device such as a liquid crystal display device is also included in the category of the semiconductor device.

2. Description of the Related Art

In recent years, display devices using liquid crystal panels or organic EL panels have been under active development. These display devices are broadly classified into display devices in which only transistors for pixel control (pixel transistors) are formed over a substrate and a scanning circuit (driver circuit) is included in a peripheral IC and display devices in which a scanning circuit is formed over the same substrate as pixel transistors.

A display device in which a driver circuit is integrated with pixel transistors is effective in reducing the frame width of the display device or the cost of the peripheral IC. However, transistors used in the driver circuit are required to have better electrical characteristics (e.g., field-effect mobility ($\mu$FE) or threshold voltage) than the pixel transistors.

A silicon-based semiconductor material is widely known as a material for a semiconductor thin film applicable to a transistor. As another material, an oxide semiconductor material has been attracting attention (for example, Patent Documents 1 and 2). For example, attention has been drawn to a transistor including a semiconductor thin film formed using an amorphous oxide that contains indium (In), gallium (Ga), and zinc (Zn) and has an electron carrier concentration of less than $10^{18}/cm^3$.

A transistor using an oxide semiconductor for a semiconductor layer has higher field-effect mobility than a transistor using for a semiconductor layer amorphous silicon which is a silicon-based semiconductor material. Hence, the transistor using an oxide semiconductor operates at high speed and is suitably used for the display device in which a driver circuit is integrated with pixel transistors. Besides, manufacturing steps of the transistor using an oxide semiconductor are easier than those of a transistor using polycrystalline silicon for a semiconductor layer.

In the case where a transistor is manufactured using an oxide semiconductor for a channel formation region, an oxygen vacancy which is formed in the oxide semiconductor adversely affects the transistor characteristics. The oxygen vacancy functions as a carrier source in the oxide semiconductor. Therefore, a large number of oxygen vacancies in the oxide semiconductor lead to generation of electrons serving as carriers, whereby the channel formation region has n-type conductivity and thus has reduced resistance. This induces degraded electrical characteristics of the transistor, such as normally-on characteristics, an increase in leakage current, and a shift of a threshold voltage by application of stress. Hence, the oxide semiconductor preferably includes as few oxygen vacancies as possible in the channel formation region.

REFERENCES

Patent Documents

[Patent Document 1] Japanese Published Patent Application No. 2007-123861
[Patent Document 2] Japanese Published Patent Application No. 2007-096055

SUMMARY OF THE INVENTION

In the case where a transistor is manufactured using an oxide semiconductor for a channel formation region, a low-resistance region (e.g., an n-type region, hereinafter referred to as an n-type region) might be formed between the oxide semiconductor and each of a source electrode layer and a drain electrode layer which are in contact with the oxide semiconductor. When the n-type region extends towards the channel formation region, the channel length (also referred to as an L length) of the transistor after its manufacture is changed from a designed channel length; and the transistor after its manufacture has a channel length smaller than the designed channel length.

In view of the above, one embodiment of the present invention provides a novel semiconductor device using an oxide semiconductor in which a reduction in channel length is controlled.

One embodiment of the present invention is a semiconductor device including an oxide semiconductor layer having a crystal part, and a source electrode layer and a drain electrode layer which are in contact with the oxide semiconductor layer. The oxide semiconductor layer includes a channel formation region and an n-type region in contact with the source electrode layer or the drain electrode layer. The crystal orientation of the crystal part is different between the channel formation region and the n-type region.

Note that in this specification and the like, the crystal orientation of a crystal part is defined with reference to the substrate surface. In an oxide semiconductor layer, crystal parts with different crystal orientations may have different crystal structures. For example, a channel formation region may have a homologous structure while an n-type region has a spinel crystal structure or a mixed crystal structure of a spinel crystal structure and a homologous structure.

One embodiment of the present invention is a semiconductor device including an oxide semiconductor layer which is over a first formation surface, a second formation surface, and a third formation surface and includes a crystal part; a source electrode layer in contact with the oxide semiconductor layer over the second formation surface; and a drain electrode layer in contact with the oxide semiconductor layer over the third formation surface. The oxide semiconductor layer includes a channel formation region and an n-type region in contact with the source electrode layer or the drain electrode layer. The channel formation region is positioned in the oxide semiconductor layer over the first formation surface. The first formation surface crosses the second formation surface and the third formation surface.

One embodiment of the present invention is a semiconductor device including a gate electrode layer; a gate insulating layer over the gate electrode layer; a source electrode layer and a drain electrode layer which are over the gate insulating layer; and an oxide semiconductor layer which is over the gate insulating layer, the source electrode layer, and the drain electrode layer and includes a crystal part. The oxide semiconductor layer includes a channel formation region and an n-type region in contact with the source electrode layer or the drain electrode layer. The crystal orientation of the crystal part is different between the channel formation region and the n-type region.

One embodiment of the present invention is a semiconductor device including a gate electrode layer; a gate insulating layer over the gate electrode layer; a source electrode layer and a drain electrode layer which are over the gate insulating layer; and an oxide semiconductor layer which is over the gate insulating layer, the source electrode layer, and the drain electrode layer and includes a crystal part. The oxide semiconductor layer includes a channel formation region and an n-type region in contact with the source electrode layer or the drain electrode layer. The channel formation region is positioned in the oxide semiconductor layer in contact with the gate insulating layer. A plane where the gate insulating layer is in contact with the oxide semiconductor layer crosses a plane where the source electrode layer is in contact with the oxide semiconductor layer and a plane where the drain electrode layer is in contact with the oxide semiconductor layer.

One embodiment of the present invention is a semiconductor device including a gate electrode layer; a gate insulating layer over the gate electrode layer; an insulating layer over the gate insulating layer; a depressed portion formed by the gate insulating layer and the insulating layer; an oxide semiconductor layer which is on the depressed portion and includes a crystal part; and a source electrode layer and a drain electrode layer which are over the insulating layer and the oxide semiconductor layer. The oxide semiconductor layer includes a channel formation region and an n-type region in contact with the source electrode layer or the drain electrode layer. The crystal orientation of the crystal part is different between the channel formation region and the n-type region.

One embodiment of the present invention is a semiconductor device including a gate electrode layer; a gate insulating layer over the gate electrode layer; a first insulating layer and a second insulating layer which are over the gate insulating layer; an oxide semiconductor layer which is over the gate insulating layer, the first insulating layer, and the second insulating layer and includes a crystal part; a source electrode layer over the first insulating layer and the oxide semiconductor layer; and a drain electrode layer over the second insulating layer and the oxide semiconductor layer. The oxide semiconductor layer includes a channel formation region and an n-type region in contact with the source electrode layer or the drain electrode layer. The channel formation region is positioned in the oxide semiconductor layer in contact with the gate insulating layer. A plane where the gate insulating layer is in contact with the oxide semiconductor layer crosses a plane where the first insulating layer is in contact with the oxide semiconductor layer and a plane where the second insulating layer is in contact with the oxide semiconductor layer.

One embodiment of the present invention is a semiconductor device including a gate electrode layer; a gate insulating layer which is over the gate electrode layer and includes a depressed portion; an oxide semiconductor layer which is on the depressed portion and includes a crystal part; and a source electrode layer and a drain electrode layer which are over the gate insulating layer and the oxide semiconductor layer. The oxide semiconductor layer includes a channel formation region and an n-type region in contact with the source electrode layer or the drain electrode layer. The crystal orientation of the crystal part is different between the channel formation region and the n-type region.

One embodiment of the present invention is a semiconductor device including a gate electrode layer; a gate insulating layer which is over the gate electrode layer and includes a first formation surface, a second formation surface, and a third formation surface; an oxide semiconductor layer which is over the first formation surface, the second formation surface, and the third formation surface and includes a crystal part; a source electrode layer in contact with the oxide semiconductor layer over the second formation surface; and a drain electrode layer in contact with the oxide semiconductor layer over the third formation surface. The oxide semiconductor layer includes a channel formation region and an n-type region in contact with the source electrode layer or the drain electrode layer. The channel formation region is positioned in the oxide semiconductor layer over the first formation surface. The first formation surface crosses the second formation surface and the third formation surface.

In any of the above embodiments of the present invention, the oxide semiconductor layer is preferably an oxide represented as an In-M-Zn oxide containing at least indium (In), zinc (Zn), and M (a metal such as Al, Ga, Ge, Y, Zr, Sn, La, Ce, or Hf).

In any of the above embodiments of the present invention, the oxide semiconductor layer is preferably an oxide represented as an In—Ga—Zn oxide.

In any of the above embodiments of the present invention, the c-axis of the crystal part is preferably aligned parallel to the normal vector of a surface where the oxide semiconductor layer is formed.

In any of the above embodiments of the present invention, the oxide semiconductor layer preferably includes a CAAC-OS.

One embodiment of the present invention is a display device including the semiconductor device described in any of the above embodiments of the present invention.

One embodiment of the present invention is a method for manufacturing a semiconductor device including the steps of forming a gate insulating layer over a gate electrode layer; forming a source electrode layer and a drain electrode layer over the gate insulating layer; and forming an oxide semiconductor layer including a crystal part over the gate insulating layer, the source electrode layer, and the drain electrode layer. The oxide semiconductor layer includes a channel formation region and an n-type region in contact with the source electrode layer or the drain electrode layer. The channel formation region is positioned in the oxide semiconductor layer in contact with the gate insulating layer. A plane where the gate insulating layer is in contact with the oxide semiconductor layer crosses a plane where the source electrode layer is in contact with the oxide semiconductor layer and a plane where the drain electrode layer is in contact with the oxide semiconductor layer.

One embodiment of the present invention is a method for manufacturing a semiconductor device including the steps of forming a gate insulating layer over a gate electrode layer; forming a first insulating layer and a second insulating layer over the gate insulating layer; forming an oxide semiconductor layer including a crystal part over the gate insulating layer, the first insulating layer, and the second insulating layer; forming a source electrode layer over the first insulating layer and the oxide semiconductor layer; and forming a drain electrode layer over the second insulating layer and the oxide semiconductor layer. The oxide semiconductor layer includes a channel formation region and an n-type region in contact with the source electrode layer or the drain electrode layer. The channel formation region is positioned in the oxide semiconductor layer in contact with the gate insulating layer. A plane where the gate insulating layer is in contact with the oxide semiconductor layer crosses a plane where the first insulating layer is in contact with the oxide semiconductor layer and a plane where the second insulating layer is in contact with the oxide semiconductor layer.

One embodiment of the present invention is a method for manufacturing a semiconductor device including the steps of forming, over a gate electrode layer, a gate insulating layer including a first formation surface, a second formation surface, and a third formation surface; forming an oxide semiconductor layer including a crystal part over the first formation surface, the second formation surface, and the third formation surface; forming a source electrode layer in contact with the oxide semiconductor layer over the second formation surface; and forming a drain electrode layer in contact with the oxide semiconductor layer over the third formation surface. The oxide semiconductor layer includes a channel formation region and an n-type region in contact with the source electrode layer or the drain electrode layer. The channel formation region is positioned in the oxide semiconductor layer over the first formation surface. The first formation surface crosses the second formation surface and the third formation surface.

It is possible to provide a novel semiconductor device using an oxide semiconductor, in which a reduction in channel length is controlled.

DETAILED DESCRIPTION OF THE INVENTION

Embodiments of the present invention will be described below in detail with reference to the drawings. However, the present invention is not limited to the following description and it is easily understood by those skilled in the art that the mode and details can be variously changed without departing from the scope and spirit of the present invention. Therefore, the present invention should not be construed as being limited to the description in the following embodiments.

(Embodiment 1)

In this embodiment, one mode of a semiconductor device of the present invention will be described with reference to FIGS. 1A to 1C.

Figure 1A:
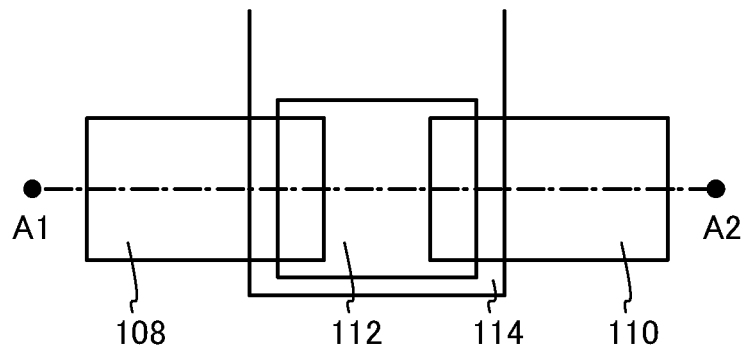
FIGS. 1A to 1C illustrate a semiconductor device of one embodiment of the present invention.

FIG. 1A is a top view of the semiconductor device; FIG. 1B, a cross-sectional view along dashed-dotted line A1-A2 in FIG. 1A; and FIG. 1C, an enlarged view of part of the semiconductor device in FIG. 1B. Note that in the top view of FIG. 1A, some components are seen transparently or omitted for simplification.

Figure 1B:
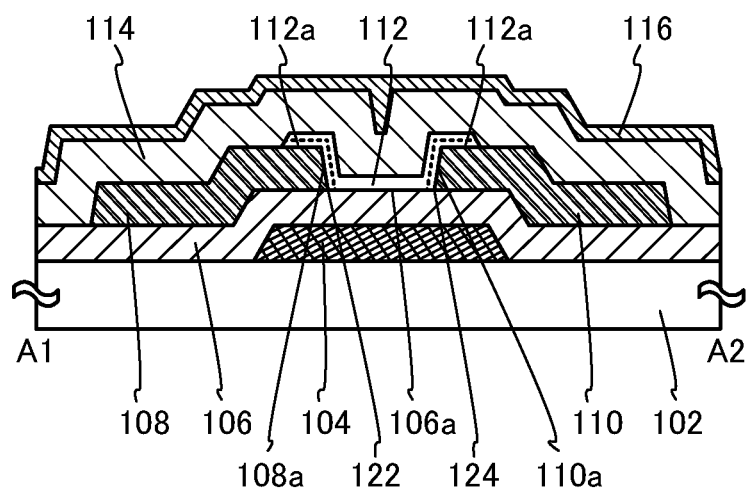

The semiconductor device illustrated in FIG. 1B includes a gate electrode layer 104 over a substrate 102, a gate insulating layer 106 over the gate electrode layer 104, a source electrode layer 108 and a drain electrode layer 110 over the gate insulating layer 106, and an oxide semiconductor layer 112 including a crystal part over the gate insulating layer 106, the source electrode layer 108, and the drain electrode layer 110.

The semiconductor device illustrated in FIG. 1B may include a third insulating layer 114 over the gate insulating layer 106, the source electrode layer 108, the drain electrode layer 110, and the oxide semiconductor layer 112, and a fourth insulating layer 116 over the third insulating layer 114.

In the oxide semiconductor layer 112, an n-type region 112*a* is formed in a region where the oxide semiconductor layer 112 is in contact with the source electrode layer 108 or the drain electrode layer 110. The n-type region 112*a* has a resistance lower than that of a channel formation region in the oxide semiconductor layer 112.

The channel formation region is positioned in the oxide semiconductor layer 112 in contact with the gate insulating layer 106. A first formation surface 106*a* is a surface where the gate insulating layer 106 is in contact with the oxide semiconductor layer 112. A second formation surface 108*a* is a surface where the source electrode layer 108 is in contact with the oxide semiconductor layer 112. The first formation surface 106*a* crosses the second formation surface 108*a* at an intersection 122. The first formation surface 106*a* also crosses, at an intersection 124, a third formation surface 110*a* where the drain electrode layer 110 is in contact with the oxide semiconductor layer 112. Note that in this specification, the first to third formation surfaces refer to surfaces over which an oxide semiconductor layer is formed, and include a curved surface as well as a flat surface. Also in this specification, the term "cross" means that surfaces intersect each other at an angle of 30° to 90°.

The oxide semiconductor layer 112 can be formed using, for example, an In-M-Zn oxide (M is a metal such as Al, Ga, Ge, Y, Zr, Sn, La, Ce, or Hf).

For example, the oxide semiconductor layer 112 can be formed using In—Ga—Zn oxide with an atomic ratio of In:Ga:Zn=1:1:1 or 3:1:2. Note that the proportion of each atom in the atomic ratio of the oxide semiconductor varies within a range of ±20% as an error. It is also to be noted that without limitation to that described above, a material with an appropriate composition may be used depending on required semiconductor characteristics and electrical characteristics (e.g., field-effect mobility and threshold voltage) of a transistor. Further, in order to obtain required semiconductor characteristics of a transistor, it is preferable to control the carrier density, the impurity concentration, the defect density, the atomic ratio of a metal element to oxygen, the interatomic distance, the density, and the like of the oxide semiconductor as appropriate.

The energy gap of the oxide semiconductor layer 112 is 2 eV or more, preferably 2.5 eV or more, and more preferably 3 eV or more. The off-state current of a transistor can be reduced by using such an oxide semiconductor having a wide energy gap.

The oxide semiconductor layer 112 has a thickness of 3 nm to 200 nm, preferably 3 nm to 100 nm.

When the oxide semiconductor layer 112 contains silicon or carbon which is an element belonging to Group 14, oxygen vacancies in the oxide semiconductor are increased so that the oxide semiconductor layer 112 has n-type conductivity.

The oxide semiconductor layer 112 includes a crystal part. The oxide semiconductor including a crystal part includes, for example, a c-axis aligned crystal (CAAC). In other words, the oxide semiconductor layer including a crystal part includes an oxide semiconductor including a CAAC.

An oxide semiconductor including a CAAC is referred to as a CAAC-OS (c-axis aligned crystalline oxide semiconductor). The CAAC-OS is not absolutely amorphous.

In an image obtained with a transmission electron microscope (TEM), for example, crystal parts can be found in the CAAC-OS in some cases. In most cases, in an image obtained with a TEM, crystal parts in the CAAC-OS each fit inside a cube whose one side is less than 100 nm, for example. In an image obtained with a TEM, a boundary between the crystal parts in the CAAC-OS is not clearly observed in some cases. Further, in an image obtained with a TEM, a grain boundary in the CAAC-OS is not clearly observed in some cases. In the CAAC-OS, since a clear grain boundary does not exist, for example, segregation of an impurity is unlikely to occur. In the CAAC-OS, since a clear grain boundary does not exist, for example, high density of defect states is unlikely to occur. In the CAAC-OS, since a clear grain boundary does not exist, for example, a reduction in electron mobility is unlikely to occur.

For example, the CAAC-OS includes a plurality of crystal parts. In the plurality of crystal parts, c-axes are aligned in a direction parallel to a normal vector of a surface where the CAAC-OS is formed or a normal vector of a surface of the CAAC-OS in some cases. When the CAAC-OS is analyzed by an out-of-plane method with an X-ray diffraction (XRD) apparatus, a peak at 2θ of around 31° which shows alignment appears in some cases. Further, for example, spots (luminescent spots) are observed in an electron diffraction pattern of the CAAC-OS in some cases. An electron diffraction pattern obtained with an electron beam having a beam diameter of 10 nmϕ or smaller, or 5 nmϕ or smaller, is called a nanobeam electron diffraction pattern. In the CAAC-OS, for example, among crystal parts, the directions of the a-axis and the b-axis of one crystal part are different from those of another crystal part, in some cases. In the CAAC-OS, for example, c-axes are aligned, and a-axes and/or b-axes are not macroscopically aligned, in some cases.

In each of the crystal parts included in the CAAC-OS, for example, a c-axis is aligned in a direction parallel to a normal vector of a surface where the CAAC-OS is formed or a normal vector of a surface of the CAAC-OS, triangular or hexagonal atomic arrangement that is seen from the direction perpendicular to the a-b plane is formed, and metal atoms are arranged in a layered manner or metal atoms and oxygen atoms are arranged in a layered manner when seen from the direction perpendicular to the c-axis. Note that among crystal parts, the directions of the a-axis and the b-axis of one crystal part may be different from those of another crystal part. In this specification, the term "perpendicular" includes a range from 80° to 100°, preferably from 85° to 95°. In addition, the term "parallel" includes a range from −10° to 10°, preferably from −5° to 5°.

The CAAC-OS can be formed by reducing the density of defect states for example. In an oxide semiconductor, for example, oxygen vacancies are defect states. The oxygen vacancies serve as trap levels or serve as carrier generation sources when hydrogen is trapped therein. In order to form the CAAC-OS, for example, it is important to prevent oxygen vacancies from being generated in the oxide semiconductor. Thus, the CAAC-OS is an oxide semiconductor having a low density of defect states. In other words, the CAAC-OS is an oxide semiconductor having few oxygen vacancies.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor has few carrier generation sources, and thus has a low carrier density in some cases. Thus, in some cases, a transistor including the oxide semiconductor in a channel formation region rarely has a negative threshold voltage (is rarely normally-on). A highly purified intrinsic or substantially highly purified intrinsic oxide semiconductor has a low density of defect states and accordingly has low density of trap states in some cases. Thus, the transistor including the oxide semiconductor in the channel formation region has little variation in electrical characteristics and high reliability in some cases. A charge trapped by the trap states in the oxide semiconductor takes a long time to disappear. The trapped charge may behave like a fixed charge. Thus, the transistor which includes the oxide semiconductor having a high density of trap states in the channel formation region has unstable electrical characteristics in some cases.

A transistor using the highly purified intrinsic or substantially highly purified intrinsic CAAC-OS has little variation in the electrical characteristics due to irradiation with visible light or ultraviolet light.

Another oxide semiconductor having any crystallinity may be used instead of the CAAC-OS.

The n-type region 112a formed in the oxide semiconductor layer 112 will be described with reference to a semiconductor device illustrated in FIGS. 7A to 7C and FIGS. 8A and 8B, which is compared with the semiconductor device of one embodiment of the present invention.

Figure 7A:
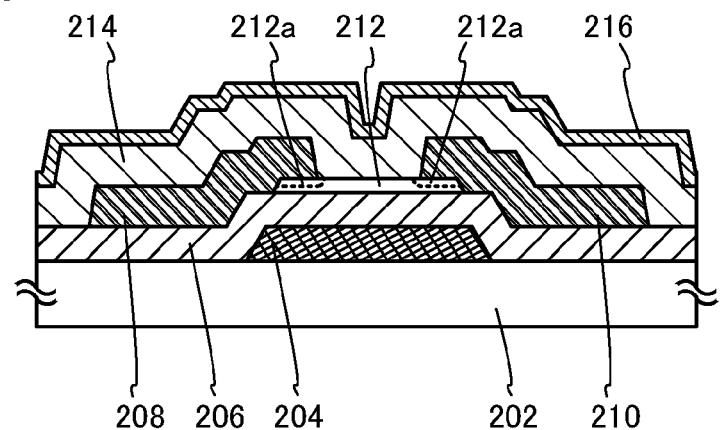
FIGS. 7A to 7C illustrate a semiconductor device which is compared with the semiconductor device of one embodiment of the present invention.
Figure 7B:
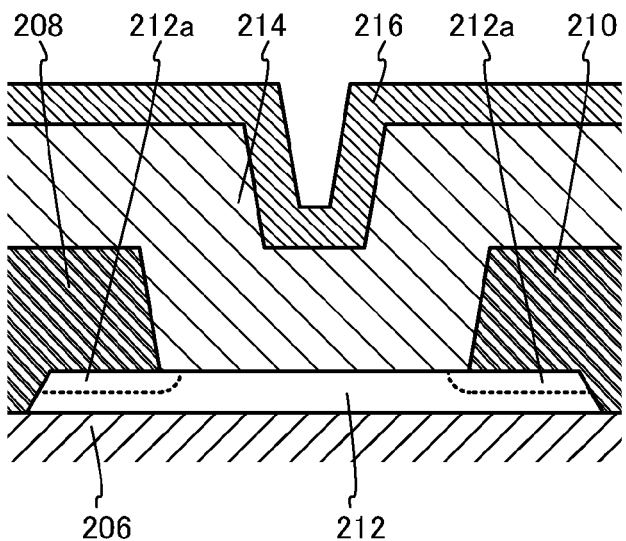
Figure 7C:
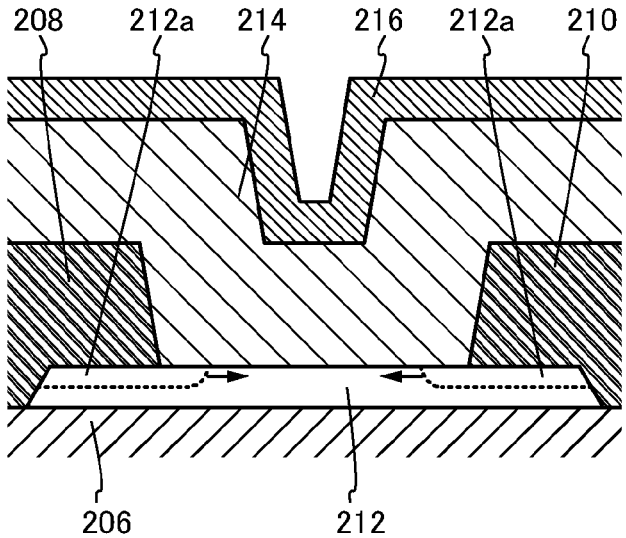

The semiconductor device illustrated in FIG. 7A is a bottom-gate top-contact transistor. FIG. 7A is a cross-sectional view of the transistor, and FIGS. 7B and 7C are enlarged views of part of the transistor in FIG. 7A. Note that the top view of the semiconductor device illustrated in FIGS. 7A to 7C is substantially the same as that of the semiconductor device illustrated in FIG. 1A, and thus is not shown here.

The semiconductor device in FIG. 7A includes a gate electrode layer 204 over a substrate 202, a gate insulating layer 206 over the gate electrode layer 204, a source electrode layer 208 and a drain electrode layer 210 over the gate insulating layer 206, and an oxide semiconductor layer 212 including a crystal part over the gate insulating layer 206, the source electrode layer 208, and the drain electrode layer 210.

The semiconductor device illustrated in FIG. 7A may include a third insulating layer 214 over the gate insulating layer 206, the source electrode layer 208, the drain electrode layer 210, and the oxide semiconductor layer 212, and a fourth insulating layer 216 over the third insulating layer 214.

In the oxide semiconductor layer 212, an n-type region 212a is formed in a region where the oxide semiconductor layer 212 is in contact with the source electrode layer 208 or the drain electrode layer 210. The n-type region 212a has a resistance lower than that of a channel formation region in the oxide semiconductor layer 212.

Figure 1C:
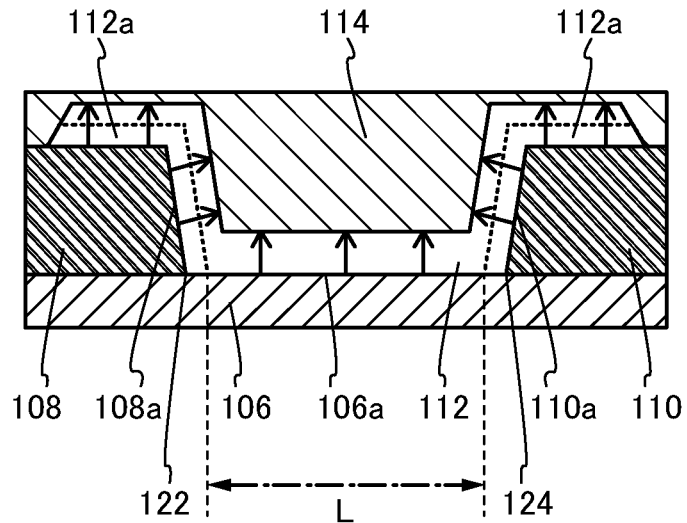

The oxide semiconductor layer 212 illustrated in FIGS. 7A to 7C and FIGS. 8A and 8B can be formed using the same material as the oxide semiconductor layer 112 illustrated in FIGS. 1A to 1C, or using an amorphous oxide semiconductor layer.

The n-type region 212a in the oxide semiconductor layer 212 is formed by damage due to sputtering for forming the source electrode layer 208 and the drain electrode layer 210, by heat treatment after the formation of the source electrode layer 208 and the drain electrode layer 210, or the like (see FIG. 7B). In other words, the n-type region 212a is formed in a region where the oxide semiconductor layer 212 is in contact with the source electrode layer 208 or the drain electrode layer 210.

The shape of the n-type region 212a depends on the material, design, manufacturing conditions, and the like of a transistor and its peripheral structure. Therefore, in the case where, for example, the n-type region 212a extends too much laterally or the channel length is designed to be short, the n-type region 212a under the source electrode layer 208 comes close to the n-type region 212a under the drain electrode layer 210.

Particularly when the oxide semiconductor layer 212 has an amorphous structure, no crystal part exists in the oxide semiconductor layer 212 and thus the n-type region 212a easily extends. In the case where the oxide semiconductor layer 212 includes a CAAC-OS, in a crystal part, metal atoms are arranged in a layered manner or metal atoms and oxygen atoms are arranged in a layered manner when seen from the direction perpendicular to the c-axis. This might cause the n-type region 212a to extend along the a-axis or the b-axis.

When the n-type region 212a extends in the oxide semiconductor layer 212, the channel length (L length) of the transistor after its manufacture is changed from the designed channel length even though the n-type region 212a under the source electrode layer 208 is not in complete contact with the n-type region 212a under the drain electrode layer 210.

For example, in the case where titanium is used for the source electrode layer 208 and the drain electrode layer 210, titanium grows like whiskers (see arrows in FIG. 7C).

In the case where the L length is designed to be short, namely, in the case where the distance between the source electrode layer 208 and the drain electrode layer 210 is short, the n-type region 212a causes electrical connection between the source electrode layer 208 and the drain electrode layer 210; thus, desired transistor characteristics cannot be obtained.

Figure 8A:
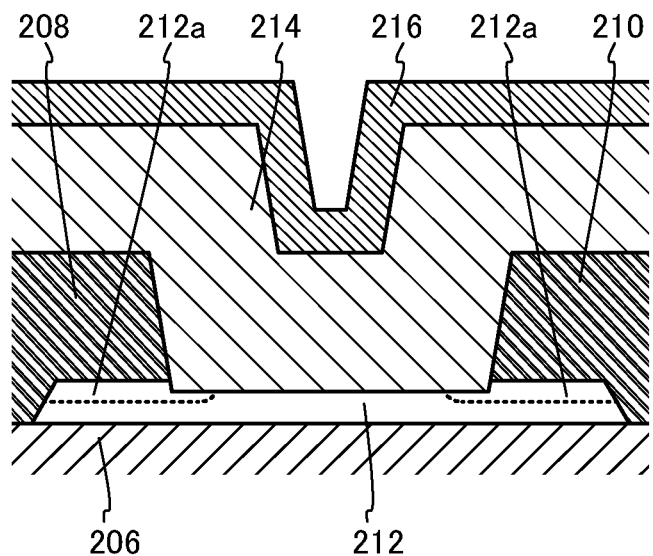
FIGS. 8A and 8B are each a cross-sectional view illustrating a semiconductor device which is compared with the semiconductor device of one embodiment of the present invention.
Figure 8B:
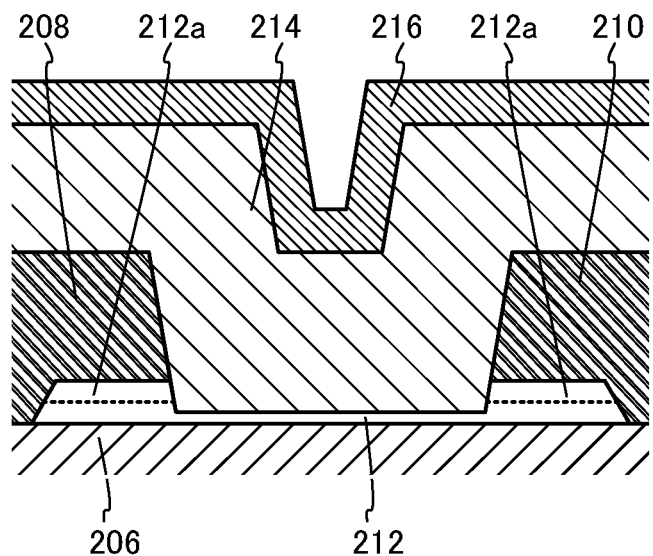

In view of the above, the n-type regions 212a are partly etched so that the oxide semiconductor layer 212 has a depressed portion as illustrated in FIG. 8A or FIG. 8B. This can prevent the electrical connection between the n-type regions 212a. Note that the n-type regions 212a can be partly removed by etching for forming the source electrode layer 208 and the drain electrode layer 210, or by treatment after the formation of the source electrode layer 208 and the drain electrode layer 210 (e.g., plasma treatment or wet etching with dilute hydrofluoric acid treatment).

However, in the structure where the oxide semiconductor layer 212 has a depressed portion, it is necessary to uniformly control the amount of etching in the substrate surface so that the channel formation region in the oxide semiconductor layer 212 has a uniform thickness, which causes variation in the thickness of the oxide semiconductor layer 212 in the substrate surface.

Hence, the n-type region 212a in the oxide semiconductor layer 212 is preferably formed in the depth direction, or the thickness direction of the oxide semiconductor layer 212, so as to prevent extension in the lateral direction.

A structure in which the n-type region is prevented from extending laterally is illustrated in FIG. 1B. The structure in FIG. 1B includes the oxide semiconductor layer 112 including a crystal part, and the source electrode layer 108 and the drain electrode layer 110 in contact with the oxide semiconductor layer 112. The oxide semiconductor layer 112 includes the channel formation region and the n-type region 112a in contact with the source electrode layer 108 or the drain electrode layer 110. The crystal orientation of the crystal part is different between the channel formation region and the n-type region 112a.

In other words, the structure in which the n-type region is prevented from extending laterally includes, as illustrated in FIG. 1B, the oxide semiconductor layer 112 including a crystal part, and the source electrode layer 108 and the drain electrode layer 110 in contact with the oxide semiconductor layer 112. The oxide semiconductor layer 112 includes the channel formation region and the n-type region 112a in contact with the source electrode layer 108 or the drain electrode layer 110. The first formation surface 106a where the gate insulating layer 106 is in contact with the oxide semiconductor layer 112 crosses, at the intersection 122, the second formation surface 108a where the source electrode layer 108 is in contact with the oxide semiconductor layer 112. The first formation surface 106a also crosses, at the intersection 124, the third formation surface 110a where the drain electrode layer 110 is in contact with the oxide semiconductor layer 112. In such a structure, the crystal orientation of the crystal part is different between the channel formation region and the n-type region 112a.

The crystal orientation of the crystal part in the oxide semiconductor layer 112 will be described with reference to FIG. 1C.

FIG. 1C is an enlarged view around the oxide semiconductor layer 112 in the semiconductor device illustrated in FIG. 1B. The oxide semiconductor layer 112 is formed on a depressed portion which is formed by the gate insulating layer 106, the source electrode layer 108, and the drain electrode layer 110. That is, the depressed portion includes the first formation surface 106a, the second formation surface 108a, and the third formation surface 110a, and the oxide semiconductor layer 112 is formed over the first formation surface 106a, the second formation surface 108a, and the third formation surface 110a. In the crystal parts of the oxide semiconductor layer 112, the c-axes are aligned in the directions denoted by arrows in FIG. 1C. The directions of the arrows in FIG. 1C are: perpendicular to the first formation surface 106a in the oxide semiconductor layer 112 in contact with the first formation surface 106a on the top surface of the gate insulating layer 106; perpendicular to the second formation surface 108a in the oxide semiconductor layer 112 in contact with the second formation surface 108a on a side surface of the source electrode layer 108; perpendicular to the third formation surface 110a in the oxide semiconductor layer 112 in contact with the third formation surface 110a on a side surface of the drain electrode layer 110; and perpendicular to the top surfaces of the source electrode layer 108 and the drain electrode layer 110 in the oxide semiconductor layer 112 in contact with those top surfaces. Note that the oxide semiconductor layer 112 including crystal parts is a CAAC-OS layer in this embodiment.

As illustrated in FIG. 1C, the n-type region 112a in the oxide semiconductor layer 112 is formed in a region where the oxide semiconductor layer 112 is in contact with the source electrode layer 108 or the drain electrode layer 110. The oxide semiconductor layer 112 is formed on the depressed portion formed by the gate insulating layer 106, the source electrode layer 108, and the drain electrode layer 110, and thus the n-type region 112a also reflects the shape of the depressed portion. This means that the crystal orientation of the crystal part is different between the n-type regions 112a, which are formed over the second formation surface 108a on the side surface of the source electrode layer 108 and formed over the third formation surface 110a on the side surface of the drain electrode layer 110, and the channel formation region over the first formation surface 106a on the top surface of the gate insulating layer 106. Hence, the crystal parts in the channel formation region and the n-type regions 112a in the oxide semiconductor layer 112 can have different crystal orientations.

Note that in the structure illustrated in FIG. 1C, part of the n-type regions 112a, specifically, the n-type regions 112a on the top surfaces of the source electrode layer 108 and the drain electrode layer 110 have the same crystal orientation as the channel formation region. However, these regions are adjacent to a region having a crystal orientation different from that in the channel formation region; therefore, the n-type regions 112a can be prevented from extending laterally.

For example, in the oxide semiconductor layer 112 in contact with the source electrode layer 108 or the drain electrode layer 110, the n-type region 112a is likely to extend perpendicularly to a direction in which the c-axis of a crystal part is aligned. Thus, the c-axis in the oxide semiconductor layer 112 in contact with the source electrode layer 108 and the drain electrode layer 110 is aligned in a direction different from the c-axis in the channel formation region, which prevents the n-type region 112a from extending towards the channel formation region.

As described above, in one embodiment of the present invention, at least part of the n-type region 112a only needs to have a crystal orientation different from that in the channel formation region.

In this embodiment, the channel formation region refers to a region in the oxide semiconductor layer 112 overlapping with the gate electrode layer 104 that is between the source electrode layer 108 and the drain electrode layer 110. Note that in the case where the oxide semiconductor layer 112 includes the n-type regions 112a as illustrated in FIGS. 1B and 1C, the channel formation region is positioned in the oxide semiconductor layer 112 overlapping with the gate electrode layer 104 that is sandwiched between the n-type regions 112a. The channel formation region thus depends on the semiconductor properties of the oxide semiconductor layer 112. Hence, the oxide semiconductor layer 112 overlapping with the gate electrode layer 104 becomes a channel formation region in the case of having i-type conductivity, and does not become a channel formation region in the case of having n-type conductivity. A channel refers to a region where current mainly flows in the channel formation region.

For example, in FIG. 1C, the channel is a region in the oxide semiconductor layer 112 overlapping with the gate electrode layer 104 that is between the n-type regions 112a and in the vicinity of the gate insulating layer 106. A channel length (L length) is denoted by L in FIG. 1C.

As described above, the n-type region 112a in the oxide semiconductor layer 112 can be prevented from extending laterally because the crystal orientation of the crystal part is different between the channel formation region in the oxide semiconductor layer 112 and the n-type region 112a in the oxide semiconductor layer 112 that is in contact with the source electrode layer 108 or the drain electrode layer 110. Accordingly, the channel length (L length) can be made substantially equal to the distance between the source electrode layer 108 and the drain electrode layer 110, which is a designed channel length.

Description will be made below on other components of the semiconductor device of one embodiment of the present invention illustrated in FIGS. 1A to 1C.

For the substrate 102, a glass material such as aluminosilicate glass, aluminoborosilicate glass, or barium borosilicate glass is used. In the mass production, a mother glass with any of the following sizes is preferably used for the substrate 102: the 8-th generation (2160 mm×2460 mm), the 9-th generation (2400 mm×2800 mm, or 2450 mm×3050 mm), the 10-th generation (2950 mm×3400 mm), and the like. High process temperature and a long period of process time drastically shrink the mother glass. Hence, in the mass production using the mother glass, heat treatment in the manufacturing process is preferably performed at 600° C. or lower, more preferably 450° C. or lower, and still more preferably 350° C. or lower.

For the gate electrode layer 104, a metal element selected from aluminum, chromium, copper, tantalum, titanium, molybdenum, and tungsten, an alloy containing any of these metal elements as a component, an alloy containing these metal elements in combination, or the like can be used. The gate electrode layer 104 may have a single-layer structure or a layered structure of two or more layers. Examples of the structure include a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like. Alternatively, a film, an alloy film, or a nitride film which contains aluminum and one or more elements selected from titanium, tantalum, tungsten, molybdenum, chromium, neodymium, and scandium may be used.

Examples of the gate insulating layer 106 are a silicon oxide film, a silicon oxynitride film, a silicon nitride oxide film, a silicon nitride film, an aluminum oxide film, a silicon nitride film, and the like, and a single layer or a stacked layer of such films is used as the gate insulating layer 106.

The gate insulating layer 106 may have a layered structure in which a silicon nitride film having few defects is used as a first silicon nitride film, a silicon nitride film which releases less hydrogen and less ammonia is used as a second silicon nitride film over the first silicon nitride film, and an oxide insulating film is formed over the second silicon nitride film. In that case, it is possible to obtain the gate insulating layer 106 that has few defects and releases less hydrogen and less ammonia. As a result, transfer of hydrogen and nitrogen, which are contained in the gate insulating layer 106, to the oxide semiconductor layer 112 can be inhibited. For example, a layered structure of a 325-nm-thick silicon nitride film and a 50-nm-thick silicon oxide film can be used as the gate insulating layer 106.

The use of a silicon nitride film as the gate insulating layer 106 offers the following effect. The silicon nitride film has a higher relative permittivity than a silicon oxide film and needs a larger thickness for an equivalent capacitance. Thus, the physical thickness of the gate insulating layer can be increased. This makes it possible to reduce a decrease in withstand voltage of a transistor and furthermore increase the withstand voltage, thereby reducing electrostatic discharge damage to the transistor.

The thickness of the gate insulating layer 106 is 5 nm to 500 nm, preferably 10 nm to 450 nm, and more preferably 50 nm to 400 nm.

The source electrode layer 108 and the drain electrode layer 110 can be formed to have a single-layer structure or a layered structure using, as a conductive material, any of single metals such as aluminum, titanium, chromium, nickel, copper, yttrium, zirconium, molybdenum, silver, tantalum, and tungsten, or an alloy containing any of these single metals as its main component. Examples of the structure include a single-layer structure of an aluminum film, a two-layer structure in which a titanium film is stacked over an aluminum film, a two-layer structure in which a titanium film is stacked over a tungsten film, a two-layer structure in which a copper film is formed over a copper-magnesium-aluminum alloy film, a three-layer structure in which a titanium film or a titanium nitride film, an aluminum film or a copper film, and a titanium film or a titanium nitride film are stacked in this order, a three-layer structure in which a molybdenum film or a molybdenum nitride film, an aluminum film or a copper film, and a molybdenum film or a molybdenum nitride film are stacked in this order, and the like. Note that a transparent conductive material containing indium oxide, tin oxide, or zinc oxide may be used for the source electrode layer 108 and the drain electrode layer 110.

As the third insulating layer 114, an oxide insulating film of an inorganic material is preferably used so as to improve the characteristics of the interface with the oxide semiconductor used as the oxide semiconductor layer 112. For example, a silicon film containing oxygen or nitrogen may be used. In particular, a silicon oxide film in which the oxygen content is higher than that in the stoichiometric composition is preferably used as the third insulating layer 114. For example, as the third insulating layer 114, a silicon oxide film, a silicon oxynitride film, or the like having a thickness of 150 nm to 400 nm can be used.

The fourth insulating layer 116 serves as a block layer to prevent moisture from entering the oxide semiconductor used as the oxide semiconductor layer 112. The fourth insulating layer 116 can be formed using a silicon nitride film, a silicon nitride oxide film, or the like. The silicon nitride film is preferably formed at high temperature in order to obtain a dense film, for example, a substrate temperature of 350° C. is possible. When the silicon nitride film is formed at high temperature, the phenomenon that oxygen is released from the oxide semiconductor used as the oxide semiconductor layer 112 and the carrier density is increased is caused in some cases; therefore, the upper limit of the temperature is a temperature at which the phenomenon is not caused.

The third insulating layer 114 and the fourth insulating layer 116 may each have a layered structure of a silicon oxynitride film and a silicon nitride film, more specifically, a layered structure in which a 150-nm-thick silicon nitride film is stacked over a 300-nm-thick silicon oxynitride film. That case is preferable because even when the silicon oxynitride film has cavities due to its poor coverage in the step resulting from the source electrode layer 108 and the drain electrode layer 110, the cavities can be well covered with the silicon nitride film.

The above is the semiconductor device of one embodiment of the present invention. One embodiment of the present invention can provide a novel semiconductor device using an oxide semiconductor, in which a channel formation region includes few oxygen vacancies. One embodiment of the present invention can also provide a novel semiconductor device using an oxide semiconductor, in which a reduction in channel length is controlled.

This embodiment can be combined with any of the other embodiments in this specification as appropriate.

(Embodiment 2)

In this embodiment, a method for manufacturing the semiconductor device shown in Embodiment 1 will be described with reference to FIG. 1B. Note that common reference numerals are used for components that have functions similar to those described in Embodiment 1, and detailed descriptions of the components are omitted.

First, the substrate 102 is prepared. Then, a conductive film is deposited on the substrate 102 and processed into a desired shape, whereby the gate electrode layer 104 is formed. After that, the gate insulating layer 106 is formed over the substrate 102 and the gate electrode layer 104. Note that the substrate 102, the gate electrode layer 104, and the gate insulating layer 106 can be formed using the aforementioned materials. In this embodiment, a glass substrate is used as the substrate 102. As the gate electrode layer 104, a 100-nm-thick tungsten film is formed by a sputtering method. As the gate insulating layer 106, a 350-nm-thick silicon nitride film and a 50-nm-thick silicon oxynitride film are formed by a PE-CVD method.

Next, a conductive film is deposited on the gate insulating layer 106 and processed into a desired shape, whereby the source electrode layer 108 and the drain electrode layer 110 are formed. The source electrode layer 108 and the drain electrode layer 110 can be formed using the aforementioned materials. In this embodiment, as the source electrode layer 108 and the drain electrode layer 110, a 50-nm-thick tungsten film, a 400-nm-thick aluminum film, and a 100-nm-thick titanium film are formed by a sputtering method.

Then, an oxide semiconductor film is deposited on the gate insulating layer 106, the source electrode layer 108, and the drain electrode layer 110 and processed into a desired shape, whereby the oxide semiconductor layer 112 is formed. As a result, the oxide semiconductor layer 112 includes the channel formation region and the n-type region 112a in contact with the source electrode layer 108 or the drain electrode layer 110, and the channel formation region is positioned in the oxide semiconductor layer 112 in contact with the gate insulating layer 106. The first formation surface 106a where the gate insulating layer 106 is in contact with the oxide semiconductor layer 112 crosses, at the intersection 122, the second formation surface 108a where the source electrode layer 108 is in contact with the oxide semiconductor layer 112. The first formation surface 106a also crosses, at the intersection 124, the third formation surface 110a where the drain electrode layer 110 is in contact with the oxide semiconductor layer 112. The oxide semiconductor layer 112 can be formed using the aforementioned materials. In this embodiment, as the oxide semiconductor layer 112, a 35-nm-thick In—Ga—Zn-based oxide film (IGZO film) is formed by a sputtering method. Note that the IGZO film is formed using a target with a composition of In:Ga:Zn=1:1:1 [atomic ratio].

In the case where a CAAC-OS is used for the oxide semiconductor layer 112, the following conditions are preferably used.

The deposition is preferably performed with high substrate temperature. For example, a CAAC-OS can be formed when an oxide semiconductor film is deposited at a substrate heating temperature of 100° C. to 740° C., preferably 100° C. to 500° C., and more preferably 150° C. to 450° C.

For example, when the CAAC-OS is formed while the concentration of impurities is reduced, the crystal state of the oxide semiconductor can be prevented from being broken by the impurities. For example, it is preferable to reduce impurities (e.g., hydrogen, water, carbon dioxide, and nitrogen) which exist in a deposition chamber of a sputtering apparatus. Furthermore, impurities in a deposition gas are preferably reduced. For example, it is preferable to use a deposition gas whose dew point is −80° C. or lower, preferably −100° C. or lower.

Furthermore, it is preferable that the proportion of oxygen in the deposition gas be increased and the power be optimized in order to reduce plasma damage at the deposition. The proportion of oxygen in the deposition gas is 30 vol % or higher, preferably 100 vol %.

After the CAAC-OS is deposited, heat treatment may be performed. The heat treatment is performed at a temperature of 100° C. to 740° C., preferably 200° C. to 500° C. The heat treatment time is 1 minute to 24 hours, preferably 6 minutes to 4 hours. The heat treatment may be performed in an inert atmosphere or an oxidation atmosphere. It is preferable to perform heat treatment in an inert atmosphere and then perform heat treatment in an oxidation atmosphere. The heat treatment in an inert atmosphere can reduce the concentration of impurities in the CAAC-OS in a short time. At the same time, the heat treatment in an inert atmosphere may generate oxygen vacancies in the CAAC-OS. In such a case, the heat treatment in an oxidation atmosphere can reduce the oxygen vacancies. The heat treatment can further increase the crystallinity of the CAAC-OS. Note that the heat treatment may be performed under a reduced pressure, such as 1000 Pa or lower, 100 Pa or lower, 10 Pa or lower, or 1 Pa or lower. The heat treatment under the reduced pressure can reduce the concentration of impurities in the CAAC-OS in a shorter time.

The concentration of hydrogen in the CAAC-OS manufactured in the above manner, which is measured by secondary ion mass spectrometry (SIMS), can be $2\times10^{20}$ atoms/cm$^3$ or lower, preferably $5\times10^{19}$ atoms/cm$^3$ or lower, more preferably $1\times10^{19}$ atoms/cm$^3$ or lower, and still more preferably $5\times10^{18}$ atoms/cm$^3$ or lower.

The concentration of nitrogen in the CAAC-OS manufactured in the above manner, which is measured by SIMS, can be lower than $5\times10^{19}$ atoms/cm$^3$, preferably $5\times10^{18}$ atoms/cm$^3$ or lower, more preferably $1\times10^{18}$ atoms/cm$^3$ or lower, and still more preferably $5\times10^{17}$ atoms/cm$^3$ or lower.

The concentration of carbon in the CAAC-OS manufactured in the above manner, which is measured by SIMS, can be lower than $5\times10^{19}$ atoms/cm$^3$, preferably $5\times10^{18}$ atoms/cm$^3$ or lower, more preferably $1\times10^{18}$ atoms/cm$^3$ or lower, and still more preferably $5\times10^{17}$ atoms/cm$^3$ or lower.

The concentration of silicon in the CAAC-OS manufactured in the above manner, which is measured by SIMS, can be lower than $5\times10^{19}$ atoms/cm$^3$, preferably $5\times10^{18}$ atoms/cm$^3$ or lower, more preferably $1\times10^{18}$ atoms/cm$^3$ or lower, and still more preferably $5\times10^{17}$ atoms/cm$^3$ or lower.

The amount of each of the following gases released from the CAAC-OS manufactured in the above manner is $1\times10^{19}$/cm$^3$ or less, preferably $1\times10^{18}$/cm$^3$ or less, which is measured by thermal desorption spectroscopy (TDS) analysis: a gas molecule (atom) having a mass-to-charge ratio (m/z) of 2 (e.g., hydrogen molecule), a gas molecule (atom) having a mass-to-charge ratio (m/z) of 18, a gas molecule (atom) having a mass-to-charge ratio (m/z) of 28, and a gas molecule (atom) having a mass-to-charge ratio (m/z) of 44.

The CAAC-OS can be formed in the aforementioned manner. The CAAC-OS is preferably used for the oxide semiconductor layer 112.

After the oxide semiconductor layer 112 is formed, heat treatment is preferably performed in order to remove hydrogen or moisture in the layer. For example, for dehydration or dehydrogenation, heat treatment may be performed at 450° C. or 350° C. in a nitrogen atmosphere for one hour.

In the case where the oxide semiconductor is used for the oxide semiconductor layer 112, in order to reduce oxygen vacancies in the oxide semiconductor, for example, heat treatment may be further performed at 450° C. or 350° C. under a mixed atmosphere of nitrogen and oxygen for one hour.

Next, the third insulating layer 114 and the fourth insulating layer 116 are formed over the gate insulating layer 106, the source electrode layer 108, the drain electrode layer 110, and the oxide semiconductor layer 112. Note that the third insulating layer 114 and the fourth insulating layer 116 can be formed using the aforementioned materials. In this embodiment, as the third insulating layer 114, a 450-nm-thick silicon oxynitride film is formed by a PE-CVD method. As the fourth insulating layer 116, a 100-nm-thick silicon nitride film is formed by a PE-CVD method.

Through the above steps, the semiconductor device of one embodiment of the present invention illustrated in FIG. 1B can be manufactured.

This embodiment can be combined with any of the other embodiments in this specification as appropriate.

(Embodiment 3)

In this embodiment, modified examples of the semiconductor device shown in Embodiment 1 will be described with reference to FIGS. 2A to 2C and FIGS. 3A to 3C.

Figure 2A:
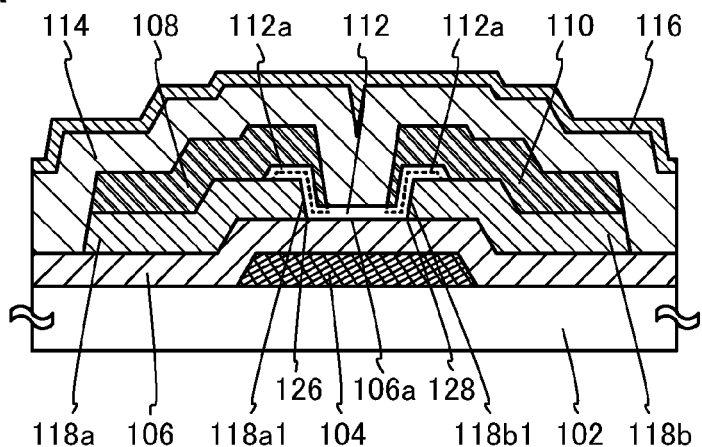
FIGS. 2A to 2C illustrate modified examples of the semiconductor device of one embodiment of the present invention.
Figure 2B:
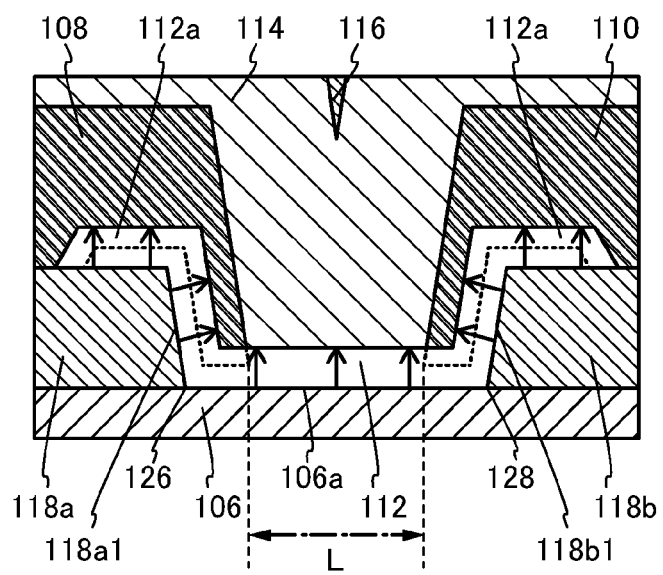
Figure 2C:
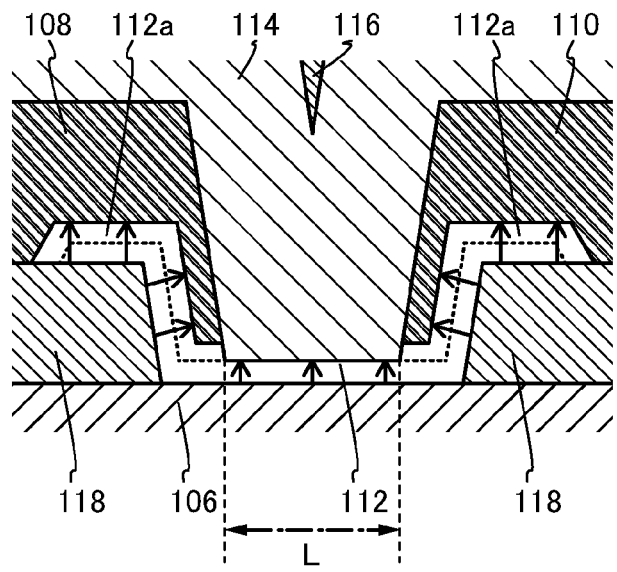

FIG. 2A is a cross-sectional view of a semiconductor device, and FIG. 2B is an enlarged view of part of the semiconductor device in FIG. 2A. Note that the top view of the semiconductor device illustrated in FIGS. 2A to 2C is substantially the same as that of the semiconductor device illustrated in FIG. 1A, and thus is not shown here. Common reference numerals are used for components that have functions similar to those described in Embodiment 1, and detailed descriptions of the components are omitted.

The semiconductor device illustrated in FIG. 2A includes the gate electrode layer 104 over the substrate 102, the gate insulating layer 106 over the gate electrode layer 104, a first insulating layer 118a and a second insulating layer 118b which are over the gate insulating layer 106, a depressed portion formed by the gate insulating layer 106, the first insulating layer 118a, and the second insulating layer 118b, the oxide semiconductor layer 112 which includes a crystal part and is formed on the depressed portion, and the source electrode layer 108 and the drain electrode layer 110 over the first insulating layer 118a, the second insulating layer 118b, and the oxide semiconductor layer 112.

In other words, the semiconductor device illustrated in FIG. 2A includes the oxide semiconductor layer 112 including a crystal part over the gate insulating layer 106, the first insulating layer 118a, and the second insulating layer 118b, the source electrode layer 108 over the first insulating layer 118a and the oxide semiconductor layer 112, and the drain electrode layer 110 over the second insulating layer 118b and the oxide semiconductor layer 112. The first formation surface 106a where the gate insulating layer 106 is in contact with the oxide semiconductor layer 112 crosses, at an intersection 126, a second formation surface 118a1 where the first insulating layer 118a is in contact with the oxide semiconductor layer 112. The first formation surface 106a also crosses, at an intersection 128, a third formation surface 118b1 where the second insulating layer 118b is in contact with the oxide semiconductor layer 112.

The semiconductor device illustrated in FIG. 2A may include the third insulating layer 114 over the gate insulating layer 106, the source electrode layer 108, the drain electrode layer 110, and the oxide semiconductor layer 112, and the fourth insulating layer 116 over the third insulating layer 114.

In the oxide semiconductor layer 112, the n-type region 112a is formed in a region where the oxide semiconductor layer 112 is in contact with the source electrode layer 108 or the drain electrode layer 110.

Unlike the semiconductor device in Embodiment 1 illustrated in FIG. 1B, the semiconductor device illustrated in FIG. 2A includes the first insulating layer 118a and the second insulating layer 118b. The semiconductor device illustrated in FIG. 2A is also different from that illustrated in FIG. 1B in the position of the source electrode layer 108 and the drain electrode layer 110 which are in contact with the oxide semiconductor layer 112. In the semiconductor device illustrated in FIG. 1B, the source electrode layer 108 and the drain electrode layer 110 are in contact with the bottom of the oxide semiconductor layer 112; in the semiconductor device illustrated in FIG. 2A, the source electrode layer 108 and the drain electrode layer 110 are in contact with the top of the oxide semiconductor layer 112. The position of the n-type region 112a in the oxide semiconductor layer 112 also differs accordingly.

The first insulating layer 118a and the second insulating layer 118b can be formed using materials similar to those that can be used for the gate insulating layer 106. Part of the first insulating layer 118a and the second insulating layer 118b can also serve as part of the gate insulating layer.

An enlarged view around the oxide semiconductor layer 112 in the semiconductor device illustrated in FIG. 2A is illustrated in FIG. 2B.

As illustrated in FIG. 2B, the oxide semiconductor layer 112 including a crystal part is formed on the depressed portion formed by the gate insulating layer 106, the first insulating layer 118a, and the second insulating layer 118b. That is, the oxide semiconductor layer 112 is formed over the first formation surface 106a, the second formation surface 118a1, and the third formation surface 118b1. In the crystal parts of the oxide semiconductor layer 112, the c-axes are aligned in the directions denoted by arrows in FIG. 2B. The directions of the arrows in FIG. 2B are perpendicular to the first formation surface 106a, the second formation surface 118a1, and the third formation surface 118b1. Note that the oxide semiconductor layer 112 including crystal parts includes the CAAC-OS described above.

As illustrated in FIG. 2B, the n-type region 112a in the oxide semiconductor layer 112 is formed in a region where the oxide semiconductor layer 112 is in contact with the source electrode layer 108 or the drain electrode layer 110. The oxide semiconductor layer 112 is formed on the depressed portion, and thus the n-type region 112a also reflects the shape of the depressed portion. That is, since the oxide semiconductor layer 112 is formed over the second formation surface 118a1 and the third formation surface 118b1, the n-type region 112a is also formed along the second formation surface 118a1 and the third formation surface 118b1. The crystal orientation of the crystal part is different between the channel formation region over the first formation surface 106a and the n-type regions 112a which are formed over the second formation surface 118a1 on the side surface of the first insulating layer 118a and over the third formation surface 118b1 on the side surface of the second insulating layer 118b. Hence, the crystal parts in the channel formation region and the n-type regions 112a in the oxide semiconductor layer 112 can have different crystal orientations.

Note that in the structure illustrated in FIG. 2B, part of the n-type regions 112a, specifically, the n-type regions 112a on the top surfaces of the first insulating layer 118a and the second insulating layer 118b have the same crystal orientation as the channel formation region over the first formation surface 106a on the top surface of the gate insulating layer 106. However, the channel formation region is adjacent to a region having a crystal orientation different from that in the channel formation region; therefore, the n-type regions 112a can be prevented from extending laterally.

As described above, in one embodiment of the present invention, at least part of the n-type region 112a only needs to have a crystal orientation different from that in the channel formation region.

In the structure illustrated in FIG. 2B, a channel length (L length) is the distance between the n-type regions 112a (the length denoted by L in FIG. 2B).

FIG. 2C is a cross-sectional view of a modified example of the structure illustrated in FIG. 2B.

The semiconductor device illustrated in FIG. 2C is different from that illustrated in FIG. 2B in that a depressed portion is formed in the top of the oxide semiconductor layer 112. The depressed portion is formed when part of the oxide semiconductor layer 112 is removed by treatment performed at the time of or after the formation of the source electrode layer 108 and the drain electrode layer 110. The structure illustrated in FIG. 2C is also one embodiment of the present invention.

A method for manufacturing the semiconductor device illustrated in FIG. 2A will be described below.

First, the substrate 102 is prepared. Then, a conductive film is deposited on the substrate 102 and processed into a desired shape, whereby the gate electrode layer 104 is formed. After that, the gate insulating layer 106 is formed over the substrate 102 and the gate electrode layer 104. Then, an insulating film is deposited on the gate insulating layer 106 and processed into a desired shape, whereby the first insulating layer 118a and the second insulating layer 118b are formed. Note that the substrate 102, the gate electrode layer 104, the gate insulating layer 106, the first insulating layer 118a, and the second insulating layer 118b can be formed using the aforementioned materials. In this embodiment, a glass substrate is used as the substrate 102. As the gate electrode layer 104, a 100-nm-thick tungsten film is formed by a sputtering method. As the gate insulating layer 106, a 350-nm-thick silicon nitride film and a 50-nm-thick silicon oxynitride film are formed by a PE-CVD method. As the first insulating layer 118a and the second insulating layer 118b, a 100-nm-thick silicon oxynitride film is formed by a PE-CVD method.

Then, an oxide semiconductor film is deposited on the gate insulating layer 106, the first insulating layer 118a, and the second insulating layer 118b, and processed into a desired shape, whereby the oxide semiconductor layer 112 is formed. As a result, the oxide semiconductor layer 112 includes the channel formation region and the n-type region 112a in contact with the source electrode layer 108 or the drain electrode layer 110, and the channel formation region is positioned in the oxide semiconductor layer 112 in contact with the gate insulating layer 106. The first formation surface 106a where the gate insulating layer 106 is in contact with the oxide semiconductor layer 112 crosses, at the intersection 126, the second formation surface 118a1 where the first insulating layer 118a is in contact with the oxide semiconductor layer 112. The first formation surface 106a also crosses, at the intersection 128, the third formation surface 118b1 where the second insulating layer 118b is in contact with the oxide semiconductor layer 112. The oxide semiconductor layer 112 can be formed using the aforementioned materials. In this embodiment, as the oxide semiconductor layer 112, a 35-nm-thick In—Ga—Zn-based oxide film (IGZO film) is formed by a sputtering method. Note that the IGZO film is formed using a target with a composition of In:Ga:Zn=1:1:1 [atomic ratio].

Next, a conductive film is deposited on the gate insulating layer 106, the first insulating layer 118a, the second insulating layer 118b, and the oxide semiconductor layer 112 and processed into a desired shape, whereby the source electrode layer 108 and the drain electrode layer 110 are formed. The source electrode layer 108 and the drain electrode layer 110 can be formed using the aforementioned materials. In this embodiment, as the source electrode layer 108 and the drain electrode layer 110, a 50-nm-thick tungsten film, a 400-nm-thick aluminum film, and a 100-nm-thick titanium film are formed by a sputtering method.

Next, the third insulating layer 114 and the fourth insulating layer 116 are formed over the gate insulating layer 106, the source electrode layer 108, the drain electrode layer 110, and the oxide semiconductor layer 112. Note that the third insulating layer 114 and the fourth insulating layer 116 can be formed using the aforementioned materials. In this embodiment, as the third insulating layer 114, a 450-nm-thick silicon oxynitride film is formed by a PE-CVD method. As the fourth insulating layer 116, a 100-nm-thick silicon nitride film is formed by a PE-CVD method.

Through the above steps, the semiconductor device illustrated in FIG. 2A can be manufactured.

Then, semiconductor devices illustrated in FIGS. 3A to 3C will be described below.

Figure 3A:
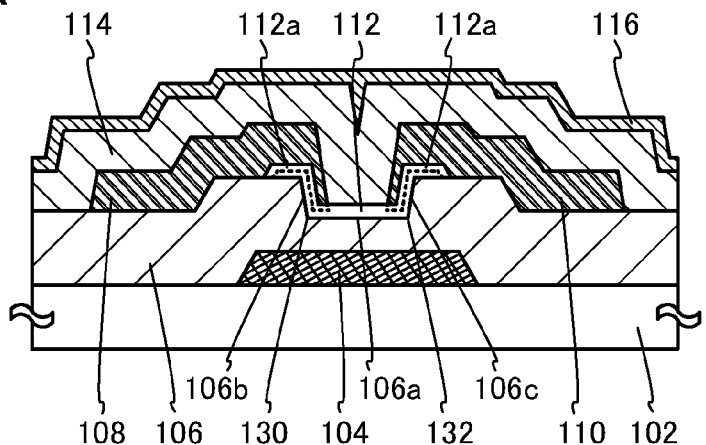
FIGS. 3A to 3C illustrate modified examples of the semiconductor device of one embodiment of the present invention.
Figure 3B:
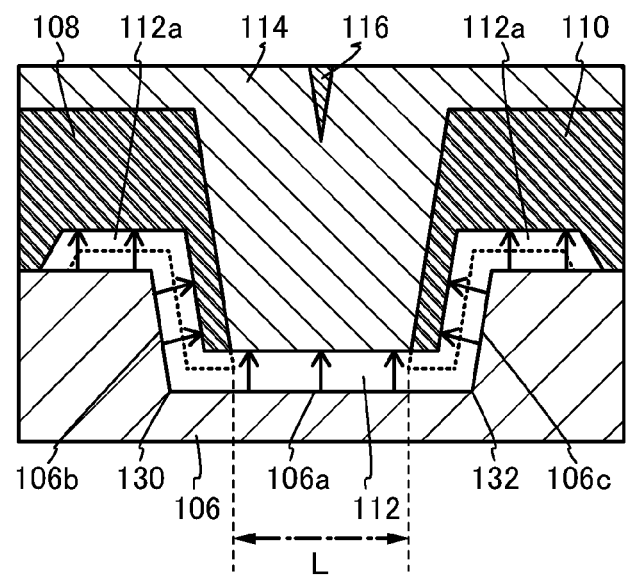

FIG. 3A is a cross-sectional view of a semiconductor device, and FIG. 3B is an enlarged view of part of the semiconductor device in FIG. 3A. Note that the top view of the semiconductor device illustrated in FIGS. 3A to 3C is substantially the same as that of the semiconductor device illustrated in FIG. 1A, and thus is not shown here. Common reference numerals are used for components that have functions similar to those described in Embodiment 1, and detailed descriptions of the components are omitted.

The semiconductor device illustrated in FIG. 3A includes the gate electrode layer 104 over the substrate 102, the gate insulating layer 106 which is over the gate electrode layer 104 and includes a depressed portion, the oxide semiconductor layer 112 which includes a crystal part and is formed on the depressed portion of the gate insulating layer 106, and the source electrode layer 108 and the drain electrode layer 110 over the gate insulating layer 106 and the oxide semiconductor layer 112.

In other words, the semiconductor device illustrated in FIG. 3A includes the gate electrode layer 104 over the substrate 102, the gate insulating layer 106 which is over the gate electrode layer 104 and includes the first formation surface 106a, the second formation surface 106b, and the third formation surface 106c, the oxide semiconductor layer 112 which is over the first formation surface 106a, the second formation surface 106b, and the third formation surface 106c and includes a crystal part, the source electrode layer 108 in contact with the oxide semiconductor layer 112 over the second formation surface 106b, and the drain electrode layer 110 in contact with the oxide semiconductor layer 112 over the third formation surface 106c. The first formation surface 106a crosses the second formation surface 106b at an intersection 130, and also crosses the third formation surface 106c at an intersection 132.

The semiconductor device illustrated in FIG. 3A may include the third insulating layer 114 over the gate insulating layer 106, the source electrode layer 108, the drain electrode layer 110, and the oxide semiconductor layer 112, and the fourth insulating layer 116 over the third insulating layer 114.

In the oxide semiconductor layer 112, the n-type region 112a is formed in a region where the oxide semiconductor layer 112 is in contact with the source electrode layer 108 or the drain electrode layer 110.

The semiconductor device illustrated in FIG. 3A is different from the semiconductor device in Embodiment 1 illustrated in FIG. 1B in the structure of the gate insulating layer 106. The gate insulating layer 106 illustrated in FIG. 3A includes a depressed portion in a channel formation region, and includes the first formation surface 106a, the second formation surface 106b, and the third formation surface 106c. The semiconductor device illustrated in FIG. 3A is also different from that illustrated in FIG. 1B in the position of the source electrode layer 108 and the drain electrode layer 110 which are in contact with the oxide semiconductor layer 112. In the semiconductor device illustrated in FIG. 1B, the source electrode layer 108 and the drain electrode layer 110 are in contact with the bottom of the oxide semiconductor layer 112; in the semiconductor device illustrated in FIG. 3A, the source electrode layer 108 and the drain electrode layer 110 are in contact with the top of the oxide semiconductor layer 112. The position of the n-type region 112a in the oxide semiconductor layer 112 also differs accordingly. Furthermore, the semiconductor device illustrated in FIG. 3A is different from that illustrated in FIG. 1B in the shape of the source electrode layer 108 and the drain electrode layer 110. As illustrated in FIG. 3B, the source electrode layer 108 and the drain electrode layer 110 may be formed in part of the depressed portion of the oxide semiconductor layer 112.

An enlarged view around the oxide semiconductor layer 112 in the semiconductor device illustrated in FIG. 3A is illustrated in FIG. 3B.

As illustrated in FIG. 3B, the oxide semiconductor layer 112 including a crystal part is formed on the depressed portion of the gate insulating layer 106. That is, the oxide semiconductor layer 112 is formed over the first formation surface 106a, the second formation surface 106b, and the third formation surface 106c of the gate insulating layer 106. In the crystal parts of the oxide semiconductor layer 112, the c-axes are aligned in the directions denoted by arrows in FIG. 3B. The respective directions of the arrows in FIG. 3B are perpendicular to the first formation surface 106a, the second formation surface 106b, and the third formation surface 106c. Note that the oxide semiconductor layer 112 including crystal parts includes the CAAC-OS described above.

As illustrated in FIG. 3B, the n-type region 112a in the oxide semiconductor layer 112 is formed in a region where the oxide semiconductor layer 112 is in contact with the source electrode layer 108 or the drain electrode layer 110. The oxide semiconductor layer 112 is formed on the depressed portion, and thus the n-type region 112a also reflects the shape of the depressed portion. That is, since the oxide semiconductor layer 112 is formed over the second formation surface 106b and the third formation surface 106c, the n-type region 112a is also formed along the second formation surface 106b and the third formation surface 106c. The crystal orientation of the crystal part is different between the channel formation region over the first formation surface 106a and the n-type regions 112a over the second formation surface 106b and the third formation surface 106c of the gate insulating layer 106. Hence, the crystal parts in the channel formation region and the n-type regions 112a in the oxide semiconductor layer 112 can have different crystal orientations.

Note that in the structure illustrated in FIG. 3B, part of the n-type regions 112a, specifically, the n-type regions 112a on the top surface of the gate insulating layer 106 have the same crystal orientation as the channel formation region over the first formation surface 106a. However, these regions are adjacent to a region having a crystal orientation different from that in the channel formation region; therefore, the n-type regions 112a can be prevented from extending laterally.

As described above, in one embodiment of the present invention, at least part of the n-type region 112a only needs to have a crystal orientation different from that in the channel formation region.

In the structure illustrated in FIG. 3B, a channel length (L length) is the distance between the n-type regions 112a (the length denoted by L in FIG. 3B).

Figure 3C:
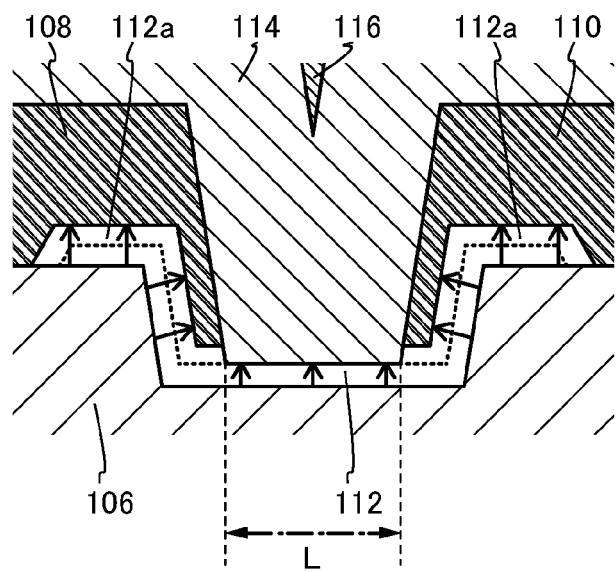

FIG. 3C is a cross-sectional view of a modified example of the structure illustrated in FIG. 3B.

The semiconductor device illustrated in FIG. 3C is different from that illustrated in FIG. 3B in that a depressed portion is formed in the top of the oxide semiconductor layer 112. The depressed portion is formed when part of the oxide semiconductor layer 112 is removed by treatment performed at the time of or after the formation of the source electrode layer 108 and the drain electrode layer 110. The structure illustrated in FIG. 3C is also one embodiment of the present invention.

A method for manufacturing the semiconductor device illustrated in FIG. 3A will be described below.

First, the substrate 102 is prepared. Then, a conductive film is deposited on the substrate 102 and processed into a desired shape, whereby the gate electrode layer 104 is formed. After that, the gate insulating layer 106 is formed over the substrate 102 and the gate electrode layer 104. Then, the gate insulating layer 106 is processed into a desired shape so as to have the formation surface 106a, the second formation surface 106b, and the third formation surface 106c. Note that the substrate 102, the gate electrode layer 104, and the gate insulating layer 106 can be formed using the aforementioned materials. In this embodiment, a glass substrate is used as the substrate 102. As the gate electrode layer 104, a 100-nm-thick tungsten film is formed by a sputtering method. As the gate insulating layer 106, a 350-nm-thick silicon nitride film and a 150-nm-thick silicon oxynitride film are formed by a PE-CVD method. The depressed portion of the gate insulating layer 106 has a depth of 100 nm.

Then, an oxide semiconductor film is deposited on the gate insulating layer 106 and processed into a desired shape, whereby the oxide semiconductor layer 112 is formed. As a result, the oxide semiconductor layer 112 includes the channel formation region and the n-type region 112a in contact with the source electrode layer 108 or the drain electrode layer 110, and the channel formation region is positioned in the oxide semiconductor layer 112 over the first formation surface 106a of the gate insulating layer 106. The first formation surface 106a crosses the second formation surface 106b of the gate insulating layer 106 at the intersection 130. The first formation surface 106a also crosses the third formation surface 106c of the gate insulating layer 106 at the intersection 132. The oxide semiconductor layer 112 can be formed using the aforementioned materials. In this embodiment, as the oxide semiconductor layer 112, a 35-nm-thick In—Ga—Zn-based oxide film (IGZO film) is formed by a sputtering method. Note that the IGZO film is formed using a target with a composition of In:Ga:Zn=1:1:1 [atomic ratio].

Next, a conductive film is deposited on the gate insulating layer 106 and the oxide semiconductor layer 112 and processed into a desired shape, whereby the source electrode layer 108 and the drain electrode layer 110 are formed. The source electrode layer 108 and the drain electrode layer 110 can be formed using the aforementioned materials. In this embodiment, as the source electrode layer 108 and the drain electrode layer 110, a 50-nm-thick tungsten film, a 400-nm-thick aluminum film, and a 100-nm-thick titanium film are formed by a sputtering method.

Next, the third insulating layer 114 and the fourth insulating layer 116 are formed over the gate insulating layer 106, the source electrode layer 108, the drain electrode layer 110, and the oxide semiconductor layer 112. Note that the third insulating layer 114 and the fourth insulating layer 116 can be formed using the aforementioned materials. In this embodiment, as the third insulating layer 114, a 450-nm-thick silicon oxynitride film is formed by a PE-CVD method. As the fourth insulating layer 116, a 100-nm-thick silicon nitride film is formed by a PE-CVD method.

Through the above steps, the semiconductor device illustrated in FIG. 3A can be manufactured.

This embodiment can be combined with any of the other embodiments in this specification as appropriate.

(Embodiment 4)

In this embodiment, modified examples of the semiconductor devices shown in Embodiments 1 and 3 will be described with reference to FIGS. 4A to 4C and FIGS. 5A and 5B. Common reference numerals are used for components that have functions similar to those described in Embodiments 1 and 3, and detailed descriptions of the components are omitted.

Figure 4A:
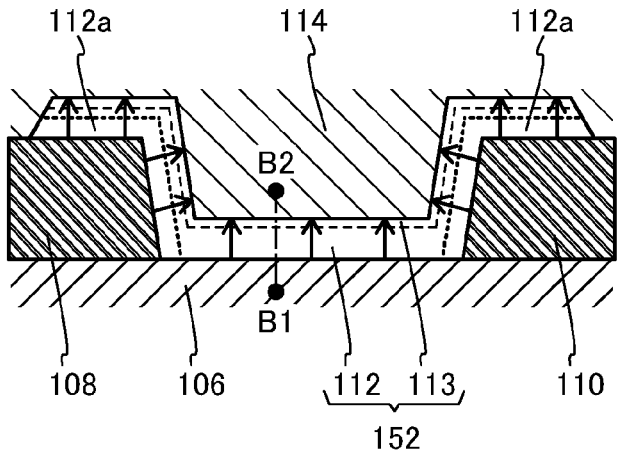
FIGS. 4A to 4C illustrate modified examples of the semiconductor device of one embodiment of the present invention.
Figure 4B:
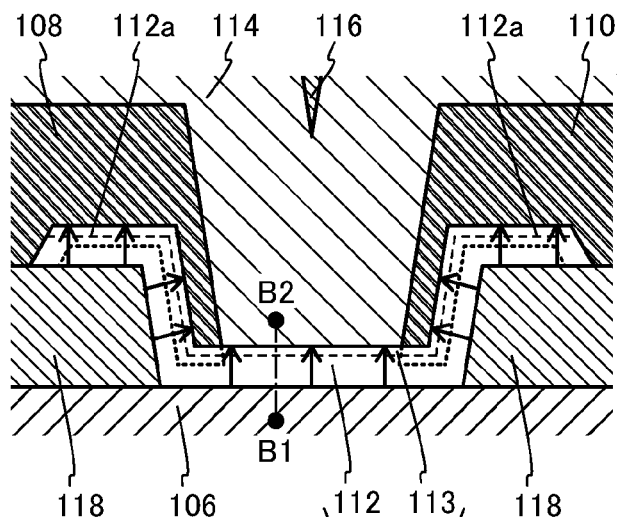
Figure 4C:
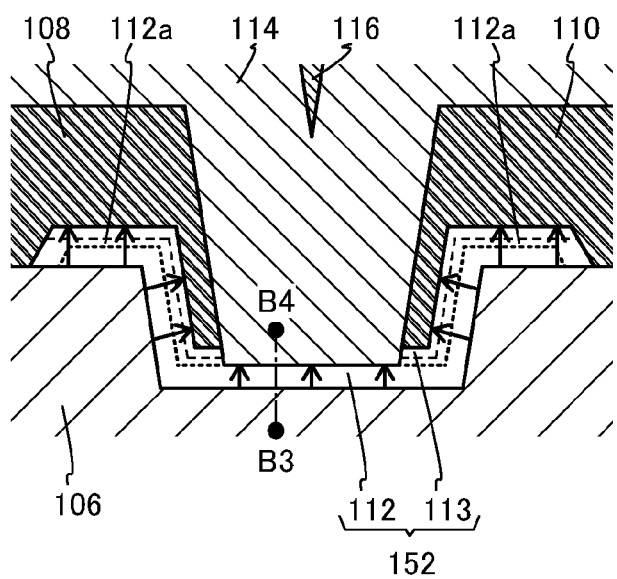

FIG. 4A is a cross-sectional view illustrating a modified example of the semiconductor device in FIG. 1C, FIG. 4B is a cross-sectional view illustrating a modified example of the semiconductor device in FIG. 2B, and FIG. 4C is a cross-sectional view illustrating a modified example of the semiconductor device in FIG. 3C. Note that FIGS. 4A to 4C are each an enlarged view illustrating part of the semiconductor device, which is around the oxide semiconductor layer 112.

In this embodiment, an oxide stack 152 is used instead of the oxide semiconductor layer 112 in the semiconductor devices illustrated in FIGS. 1A to 1C, FIGS. 2A to 2C, and FIGS. 3A to 3C.

The oxide stack 152 includes the oxide semiconductor layer 112 and an oxide layer 113 over the oxide semiconductor layer 112.

The oxide stack 152 will be described below in detail.

The oxide semiconductor layer 112 can be formed using the materials shown in Embodiment 1. It is particularly preferable that the oxide semiconductor layer 112 include an oxide semiconductor layer represented as an In-M-Zn oxide containing at least indium (In), zinc (Zn), and M (M is a metal such as Al, Ga, Ge, Y, Zr, Sn, La, Ce, or Hf).

The oxide layer 113 contains one or more kinds of elements contained in the oxide semiconductor layer 112. The energy at the bottom of the conduction band of the oxide layer 113 is located closer to the vacuum level than that of the oxide semiconductor layer 112 by 0.05 eV or more, 0.07 eV or more, 0.1 eV or more, or 0.15 eV or more and 2 eV or less, 1 eV or less, 0.5 eV or less, or 0.4 eV or less. In this case, when an electric field is applied to the gate electrode layer 104, a channel is formed in the oxide semiconductor layer 112 in the oxide stack 152 of which energy at the bottom of the conduction band is the lowest. In other words, since the oxide layer 113 is placed between the oxide semiconductor layer 112 and the third insulating layer 114, the channel of the transistor can be formed in the oxide semiconductor layer 112 not in contact with the third insulating layer 114.

Because the oxide layer 113 contains one or more elements contained in the oxide semiconductor layer 112, interface scattering is unlikely to occur at the interface between the oxide semiconductor layer 112 and the oxide layer 113. Thus, transfer of carriers is not inhibited between the oxide semiconductor layer 112 and the oxide layer 113, resulting in an increase in the field-effect mobility of the transistor. Moreover, an interface state is less likely to be produced between the oxide semiconductor layer 112 and the oxide layer 113. If an interface state is produced between the oxide semiconductor layer 112 and the oxide layer 113, a second transistor in which the interface between the oxide semiconductor layer 112 and the oxide layer 113 serves as a channel and which has a different threshold voltage from the transistor is formed and the apparent threshold voltage of the transistor varies in some cases. The oxide layer 113 thus contributes to a reduction in variation in the electrical characteristics of the transistors such as the threshold voltage.

As the oxide layer 113, an oxide layer that is represented as an In-M-Zn-based oxide (M is a metal such as Al, Ti, Ga, Ge, Y, Zr, Sn, La, Ce, or Hf) and contains a larger amount of M in an atomic ratio than that in the oxide semiconductor layer 112 is used. Specifically, the amount of any of the above elements in the oxide layer 113 in an atomic ratio is one and a half times or more, preferably twice or more, and more preferably three times or more as large as that in the oxide semiconductor layer 112 in an atomic ratio. Any of the above elements is more strongly bonded to oxygen than indium is, and thus has a function of suppressing generation of oxygen vacancies in the oxide layer. In other words, oxygen vacancies are less likely to be generated in the oxide layer 113 than in the oxide semiconductor layer 112.

That is to say, when each of the oxide semiconductor layer 112 and the oxide layer 113 is an In-M-Zn-based oxide containing at least indium, zinc, and M (M is a metal such as Al, Ti, Ga, Ge, Y, Zr, Sn, La, Ce, or Hf), the oxide layer 113 has an atomic ratio of In to M and Zn which is $x_1:y_1:z_1$, and the oxide semiconductor layer 112 has an atomic ratio of In to M and Zn which is $x_2:y_2:z_2$, $y_1/x_1$ is preferably larger than $y_2/x_2$, and $y_1/x_1$ is one and a half times or more, preferably two times or more, and more preferably three times or more as large as $y_2/x_2$. In that case, when $y_2$ is greater than or equal to $x_2$ in the oxide semiconductor layer 112, a transistor can have stable electrical characteristics. However, when $y_2$ is 3 times or more as large as $x_2$, the field-effect mobility of the transistor is reduced; accordingly, $y_2$ is preferably less than 3 times $x_2$.

Note that when the oxide semiconductor layer 112 is an In-M-Zn oxide layer, the atomic ratio of In to M is preferably as follows: the proportion of In is 25 atomic % or higher and the proportion of M is lower than 75 atomic %; more preferably, the proportion of In is 34 atomic % or higher and the proportion of M is lower than 66 atomic %. When the oxide layer 113 is an In-M-Zn oxide layer, the atomic ratio of In to M is preferably as follows: the proportion of In is lower than 50 at. % and the proportion of M is 50 at. % or higher; more preferably, the proportion of In is lower than 25 at. % and the proportion of M is 75 at. % or higher.

For the oxide semiconductor layer 112 and the oxide layer 113, an oxide semiconductor containing indium, zinc, and gallium can be used. Specifically, the oxide semiconductor layer 112 can be formed using an In—Ga—Zn oxide whose atomic ratio of In to Ga and Zn is 1:1:1, an In—Ga—Zn oxide whose atomic ratio of In to Ga and Zn is 3:1:2, or an oxide having a composition in the neighborhood of any of the above atomic ratios. The oxide layer 113 can be formed using an In—Ga—Zn oxide whose atomic ratio of In to Ga and Zn is 1:3:2, an In—Ga—Zn oxide whose atomic ratio of In to Ga and Zn is 1:3:4, an In—Ga—Zn oxide whose atomic ratio of In to Ga and Zn is 1:6:2, an In—Ga—Zn oxide whose atomic ratio of In to Ga and Zn is 1:6:4, an In—Ga—Zn oxide whose atomic ratio of In to Ga and Zn is 1:6:10, an In—Ga—Zn oxide whose atomic ratio of In to Ga and Zn is 1:9:6, or an oxide having a composition in the neighborhood of any of the above atomic ratios.

The oxide semiconductor layer 112 has a thickness of 3 nm to 200 nm, preferably 3 nm to 100 nm, and more preferably 3 nm to 50 nm. The oxide layer 113 has a thickness of 3 nm to 100 nm, preferably 3 nm to 50 nm.

The energy band structure along dashed-dotted line B1-B2 in the vicinity of the oxide stack 152 in FIGS. 4A and 4B is described with reference to FIG. 5A.

Figure 5A:
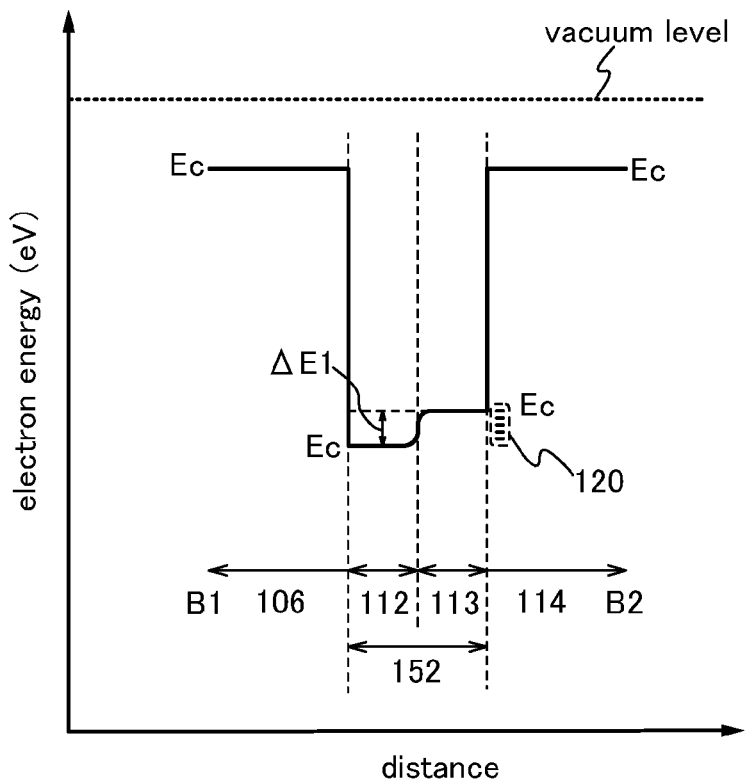
FIGS. 5A and 5B are each a band diagram of the semiconductor device of one embodiment of the present invention.

In the energy band structure shown in FIG. 5A, for example, an In—Ga—Zn oxide (an atomic ratio of In to Ga and Zn is 1:1:1) with an energy gap of 3.15 eV is used for the oxide semiconductor layer 112, and an In—Ga—Zn oxide (an atomic ratio of In to Ga and Zn is 1:3:2) with an energy gap of 3.5 eV is used for the oxide layer 113. In FIG. 5A, Ec represents the energy at the bottom of the conduction band of each of the gate insulating layer 106, the oxide semiconductor layer 112, the oxide layer 113, and the third insulating layer 114.

As shown in FIG. 5A, in the oxide stack 152, the bottom of the conduction band in the vicinity of the interface between the oxide semiconductor layer 112 and the oxide layer 113 varies continuously. That is, in the vicinity of the interface between the oxide semiconductor layer 112 and the oxide layer 113, there exist no or few impurities which form a defect state such as a trap center or a recombination center, and thus the energies vary gradually without a barrier. In this specification, such a junction is referred to as continuous junction. Such a band shape is caused by mutual transfer of oxygen between the oxide semiconductor layer 112 and the oxide layer 113. If impurities are mixed between the semiconductor layer and the oxide layer which are stacked, the continuity of the energy band is lost and carriers disappear by being trapped or recombined at the interface. The energy at the bottom of the conduction band of the oxide semiconductor layer 112 is the lowest in the oxide stack 152; therefore, this region serves as a channel.

To form such a continuous junction, it is necessary to stack the layers in succession without exposure to the air using a multi-chamber deposition apparatus (sputtering apparatus) provided with load lock chambers. Each chamber of the sputtering apparatus is preferably evacuated to a high vacuum (to about $5 \times 10^{-7}$ Pa to $1 \times 10^{-4}$ Pa) by an adsorption vacuum pump such as a cryopump so that water and the like acting as impurities for the oxide semiconductor are removed as much as possible. Alternatively, a combination of a turbo molecular pump and a cold trap is preferably used to prevent back-flow of a gas from an exhaust system into a chamber.

Note that for each of the oxide semiconductor layer 112 and the oxide layer 113, an energy difference between the vacuum level and the bottom of the conduction band (the difference is also referred to as an electron affinity) can be obtained by subtracting an energy gap from an energy difference between the vacuum level and the top of the valence band (the difference is also referred to as an ionization potential). The energy gap can be measured with the use of a spectroscopic ellipsometer, and ionization potential can be measured using an ultraviolet photoelectron spectroscopy (UPS) apparatus.

Note that when the energy difference $\Delta E1$ of the bottom of the conduction band between the oxide semiconductor layer 112 and the oxide layer 113 is small, carriers flowing in the oxide semiconductor layer 112 transcend the bottom of the conduction band of the oxide layer 113 and are captured by trap levels 120. Thus, the energy difference $\Delta E1$ of the bottom of the conduction band between the oxide semiconductor layer 112 and the oxide layer 113 is 0.1 eV or more, preferably 0.15 eV or more.

Since the oxide stack 152 includes the oxide layer 113, the channel of the transistor can be formed in the oxide semiconductor layer 112 not in contact with the third insulating layer 114. Furthermore, in the case where the third insulating layer 114 is formed using, for example, a silicon oxide film containing more oxygen than that in the stoichiometric composition, oxygen can be moved from the third insulating layer 114 to the oxide semiconductor layer 112 included in the oxide stack 152, whereby oxygen vacancies in the oxide semiconductor layer 112 can be reduced.

The energy band structure along dashed-dotted line B3-B4 in the vicinity of the oxide stack 152 in FIG. 4C is described with reference to FIG. 5B.

Figure 5B:
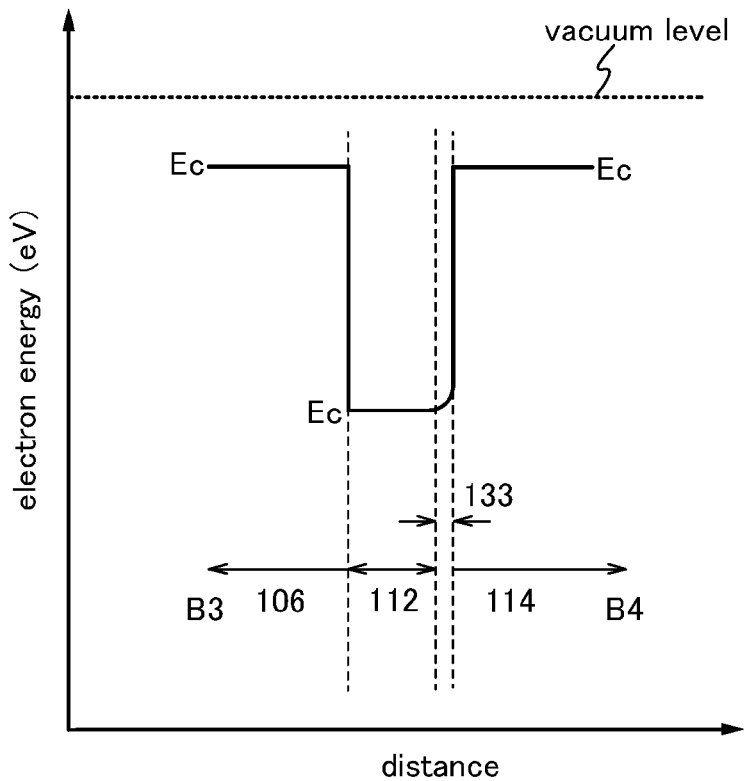

In FIG. 5B, Ec represents the energy at the bottom of the conduction band of each of the gate insulating layer 106, the oxide semiconductor layer 112, and the third insulating layer 114.

In the structure illustrated in FIG. 4C, an upper portion of the oxide stack 152, namely, part of the oxide layer 113 is etched in some cases in formation of the source electrode layer 108 and the drain electrode layer 110. Particularly when the oxide layer 113 is etched by a wet etching method, In is preferentially removed in some cases. Therefore, a $GaO_x$ layer or a mixed layer of the oxide semiconductor layer 112 and the oxide layer 113 (hereinafter referred to as a $GaO_x$ layer or a mixed layer 133) is formed in some cases on the upper surface of the oxide semiconductor layer 112.

For example, when the oxide semiconductor layer 112 is an In—Ga—Zn oxide whose atomic ratio of In to Ga and Zn is 1:1:1 or an In—Ga—Zn oxide whose atomic ratio of In to Ga and Zn is 3:1:2, and the oxide layer 113 is an In—Ga—Zn oxide whose atomic ratio of In to Ga and Zn is 1:3:2 or an In—Ga—Zn oxide whose atomic ratio of In to Ga and Zn is 1:6:4, the Ga content in the oxide layer 113 is higher than that in the oxide semiconductor layer 112. Thus, a $GaO_x$ layer or the mixed layer 133 is formed on the top surface of the oxide semiconductor layer 112.

For that reason, even when the oxide layer 113 is partly removed, the energy at the bottom of the conduction band of the oxide semiconductor layer 112 on the side of the third insulating layer 114 is probably increased so that the band structure shown in FIG. 5B is obtained.

This embodiment shows an example where the oxide stack 152 has a two-layer structure of the oxide semiconductor layer 112 and the oxide layer 113, but this example does not limit the present invention and a stacked structure of three or more layers can be employed for example. An example of a three-layer structure may be such that another layer is provided under the oxide stack 152, i.e., under the oxide semiconductor layer 112. The layer under the oxide semiconductor layer 112 can have a structure similar to that of the oxide layer 113, for example.

This embodiment can be combined with any of the other embodiments in this specification as appropriate.

(Embodiment 5)

In this embodiment, a display device using the semiconductor device of one embodiment of the present invention will be described with reference to FIGS. 6A and 6B.

Figure 6A:
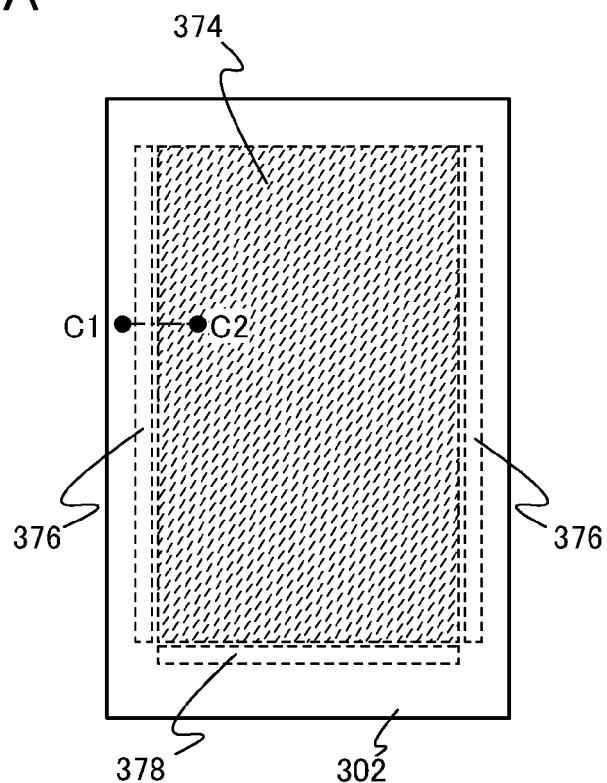
FIGS. 6A and 6B illustrate a display device including the semiconductor device of one embodiment of the present invention.
Figure 6B:
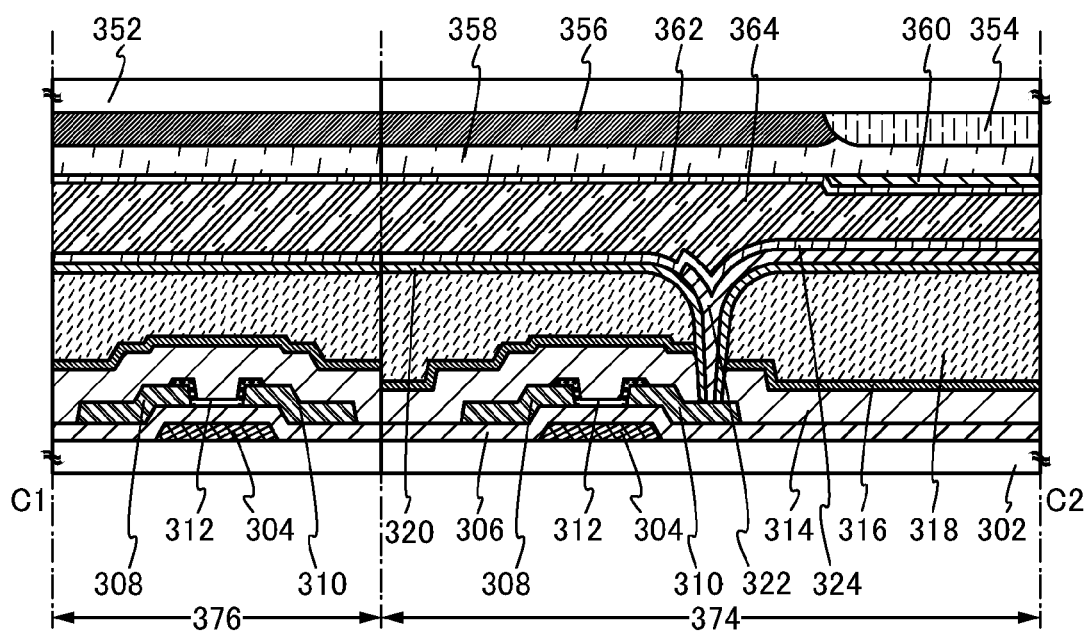

FIG. 6A is a top view of a display device and FIG. 6B is a cross-sectional view along dashed-dotted line C1-C2 in FIG. 6A.

In the display device illustrated in FIG. 6A, a sealant (not illustrated) is provided so as to surround a pixel portion 374 over a first substrate 302, and gate driver circuit portions 376 and a source driver circuit portion 378, which are adjacent to the outside of the pixel portion 374 and supply signals to the pixel portion 374. Then, sealing is performed with a second substrate (not illustrated). Thus, the pixel portion 374, the gate driver circuit portions 376, and the source driver circuit portion 378 are sealed with display elements by the first substrate 302, the sealant, and the second substrate.

FIG. 6A shows an example in which the gate driver circuit portions 376 and the source driver circuit portion 378 are formed over the first substrate 302 where the pixel portion 374 is formed; however, this structure does not limit the present invention. For example, only the gate driver circuit portions 376 may be formed over the first substrate 302 and a separately prepared substrate where a source driver circuit is formed (e.g., a driver circuit substrate formed using a single crystal semiconductor film or a polycrystalline semiconductor film) may be mounted on the first substrate 302.

FIG. 6A shows an example in which the two gate driver circuit portions 376 are placed on both sides of the pixel portion 374, though this structure does not limit the present invention. For example, the gate driver circuit portion 376 may be placed on only a side of the pixel portion 374.

Note that there is no particular limitation on the method of connecting a separately prepared driver circuit substrate, and a chip on glass (COG) method, a wire bonding method, a tape automated bonding (TAB) method, or the like can be used.

As described above, some or all of the driver circuits which include transistors can be formed over the first substrate 302 where the pixel portion 374 is formed, so that a system-on-panel can be obtained.

A driving transistor is formed in the gate driver circuit portion 376 which is a driver circuit. The gate driver circuit portion 376 can supply a signal to a transistor included in each pixel of the pixel portion 374.

For specific description of the structure of the display device illustrated in FIG. 6A, the structure of the display device is described below with reference to FIG. 6B, a cross-sectional view along line C1-C2 in FIG. 6A. In the display device illustrated in FIG. 6B, a liquid crystal element is used as a display element, and a vertical alignment (VA) mode is used as a driving mode. One mode of the display device is described here.

The gate driver circuit portion 376 includes the first substrate 302 and the driving transistor which includes a gate electrode layer 304 over the first substrate 302, a gate insulating layer 306 over the gate electrode layer 304, a source electrode layer 308 and a drain electrode layer 310 over the gate insulating layer 306, and an oxide semiconductor layer 312 over the gate insulating layer 306, the source electrode layer 308, and the drain electrode layer 310.

Furthermore, in the gate driver circuit portion 376, a third insulating layer 314 is formed over the driving transistor, specifically, over the gate insulating layer 306, the source electrode layer 308, the drain electrode layer 310, and the oxide semiconductor layer 312, a fourth insulating layer 316 is formed over the third insulating layer 314, a planarization insulating layer 318 is formed over the fourth insulating layer 316, a fifth insulating layer 320 is formed over the planarization insulating layer 318, a first alignment film 324 is formed over the fifth insulating layer 320, a liquid crystal layer 364 is formed over the first alignment film 324, a second alignment film 362 is formed over the liquid crystal layer 364, an organic insulating layer 358 is formed over the second alignment film 362, a light-blocking layer 356 is formed over the organic insulating layer 358, and a second substrate 352 is formed over the light-blocking layer 356.

The pixel portion 374 includes the first substrate 302 and the pixel transistor which includes the gate electrode layer 304 over the first substrate 302, the gate insulating layer 306 over the gate electrode layer 304, the source electrode layer 308 and the drain electrode layer 310 over the gate insulating layer 306, and the oxide semiconductor layer 312 over the gate insulating layer 306, the source electrode layer 308, and the drain electrode layer 310.

Furthermore, in the pixel portion 374, the third insulating layer 314 is formed over the pixel transistor, specifically, over the gate insulating layer 306, the source electrode layer 308, the drain electrode layer 310, and the oxide semiconductor layer 312, the fourth insulating layer 316 is formed over the third insulating layer 314, and the planarization insulating layer 318 is formed over the fourth insulating layer 316. An opening reaching the drain electrode layer 310 of the pixel transistor is formed in the third insulating layer 314, the fourth insulating layer 316, and the planarization insulating layer 318. The fifth insulating layer 320 is formed in the opening and over the planarization insulating layer 318. A pixel electrode layer 322 is formed in the opening reaching the drain electrode layer 310 and over the fifth insulating layer 320. The first alignment film 324 is formed over the fifth insulating layer 320 and the pixel electrode layer 322, the liquid crystal layer 364 is formed over the first alignment film 324, the second alignment film 362 is formed over the liquid crystal layer 364, a counter electrode layer 360 is formed over the second alignment film 362, the organic insulating layer 358 is formed over the counter electrode layer 360, a coloring layer 354 and the light-blocking layer 356 are formed over the organic insulating layer 358, and the second substrate 352 is formed over the coloring layer 354 and the light-blocking layer 356.

Note that a liquid crystal element which is a display element is formed with the pixel electrode layer 322, the first alignment film 324, the liquid crystal layer 364, the second alignment film 362, and the counter electrode layer 360.

In this embodiment, the semiconductor device shown in Embodiment 1 is used for the driving transistor in the gate driver circuit portion 376 and the pixel transistor in the pixel portion 374. Thus, the semiconductor device of one embodiment of the present invention can be used for the driving transistor or the pixel transistor in the display device.

When the semiconductor device of one embodiment of the present invention is used for the driving transistor or the pixel transistor in the display device, a reduction in channel length is controlled in the driving transistor or the pixel transistor. This results in an improvement in the display quality of the display device.

Note that in the display device illustrated in FIG. 6B, the first substrate 302, the gate electrode layer 304, the gate insulating layer 306, the source electrode layer 308, the drain electrode layer 310, the oxide semiconductor layer 312, the third insulating layer 314, and the fourth insulating layer 316 have functions similar to those of the substrate 102, the gate electrode layer 104, the gate insulating layer 106, the source electrode layer 108, the drain electrode layer 110, the oxide semiconductor layer 112, the third insulating layer 114, and the fourth insulating layer 116 shown in Embodiment 1, respectively, and can be formed using the materials and methods described in Embodiment 1.

In the display device illustrated in FIG. 6B, the planarization insulating layer 318 can be formed using an organic material having heat resistance, such as an acrylic-based resin, a polyimide-based resin, a benzocyclobutene-based resin, a polyamide-based resin, or an epoxy-based resin. Note that the planarization insulating layer 318 may be formed by stacking a plurality of insulating layers formed using any of these materials. With the use of the planarization insulating layer 318, the unevenness of the transistor and the like can be reduced. The pixel electrode layer 322 and the counter electrode layer 360 each can be formed using a light-transmitting conductive material such as indium oxide containing tungsten oxide, indium zinc oxide containing tungsten oxide, indium oxide containing titanium oxide, indium tin oxide containing titanium oxide, indium tin oxide (ITO), indium zinc oxide, or indium tin oxide to which silicon oxide is added.

In the display device illustrated in FIG. 6B, the fifth insulating layer 320 can be formed using a material and a method similar to those of the fourth insulating layer 316. The first alignment film 324 and the second alignment film 362 each can be formed using an organic material having heat resistance such as an acrylic-based resin, a polyimide-based resin, a benzocyclobutene-based resin, a polyamide-based resin, or an epoxy-based resin. A liquid crystal material that can be used for the liquid crystal layer 364 is thermotropic liquid crystal, low-molecular liquid crystal, high-molecular liquid crystal, polymer dispersed liquid crystal, ferroelectric liquid crystal, anti-ferroelectric liquid crystal, or the like. Such a liquid crystal material exhibits a cholesteric phase, a smectic phase, a cubic phase, a chiral nematic phase, an isotropic phase, or the like depending on conditions.

This embodiment shows an example of the display device using a vertical alignment (VA) mode for the liquid crystal element, without being limited thereto. For example, a twisted nematic (TN) mode, an in-plane-switching (IPS) mode, a fringe field switching (FFS) mode, an axially symmetric aligned micro-cell (ASM) mode, an optical compensated birefringence (OCB) mode, a ferroelectric liquid crystal (FLC) mode, or an antiferroelectric liquid crystal (AFLC) mode can be used.

Examples of the vertical alignment mode include a multi-domain vertical alignment (MVA) mode and a patterned vertical alignment (PVA) mode. Moreover, it is possible to use a method called domain multiplication or multi-domain design, in which a pixel is divided into some regions (subpixels) and molecules are aligned in different directions in their respective regions.

Although not illustrated in FIGS. 6A and 6B, an optical member (optical substrate) such as a polarizing member, a retardation member, or an anti-reflection member may be provided as appropriate. For example, circular polarization may be employed by using a polarizing substrate and a retardation substrate. In addition, a backlight, a side light, or the like may be used as a light source.

As a display method in the pixel portion 374, progressive scan, interlace scan, or the like can be employed. Further, color elements controlled in a pixel at the time of color display are not limited to three colors: R (red), G (green), and B (blue). For example, R, G, B, and W (white) can be used, or one or more colors of yellow, cyan, magenta, and the like can be added to RGB. Further, the sizes of display regions may be different between respective dots of color elements. Note that the disclosed invention can be applied not only to a display device for color display but also to a display device for monochrome display.

A spacer (not illustrated) is formed on the second substrate 352 so as to control the distance (cell gap) between the first substrate 302 and the second substrate 352. Note that the cell gap determines the thickness of the liquid crystal layer 364. The spacer may have any shape; for example, a spherical spacer or a columnar spacer formed by selective etching of an insulating layer may be used.

The coloring layer 354 functions as a so-called color filter. The coloring layer 354 may be formed using a material transmitting light in a specific wavelength band; for example, an organic resin film including a dye or a pigment can be used.

The light-blocking layer 356 functions as a so-called black matrix. The light-blocking layer 356 can be formed using any film that can block light emitted from adjacent pixels, such as a metal film or an organic resin film including a black dye or a black pigment.

The organic insulating layer 358 is provided so that an ionic substance included in the coloring layer 354 is not dispersed into the liquid crystal layer 364. However, the organic insulating layer 358 is not necessarily provided, without being limited to that structure.

As the sealant, a thermosetting resin, an ultraviolet curable resin, or the like can be used.

The above is the display device using the semiconductor device of one embodiment of the present invention.

One embodiment of the present invention can also be applied to an electronic device including the aforementioned display device.

This embodiment can be combined with any of the other embodiments in this specification as appropriate.

This application is based on Japanese Patent Application serial No. 2013-083132 filed with Japan Patent Office on Apr. 11, 2013, the entire contents of which are hereby incorporated by reference.

What is claimed is:

1. A semiconductor device comprising:
   a gate electrode layer;
   a gate insulating layer over the gate electrode layer;
   a first insulating layer and a second insulating layer over the gate insulating layer;
   an oxide semiconductor layer over the gate insulating layer, the first insulating layer, and the second insulating layer, the oxide semiconductor layer including a channel formation region and a pair of n-type regions;
   a source electrode layer over the first insulating layer and the oxide semiconductor layer; and
   a drain electrode layer over the second insulating layer and the oxide semiconductor layer,
   wherein the channel formation region is in contact with the gate insulating layer,
   wherein one of the pair of n-type regions is in contact with a top surface and a side surface of the first insulating layer,
   wherein the other of the pair of n-type regions is in contact with a top surface and a side surface of the second insulating layer,
   wherein a plane where the gate insulating layer is in contact with the oxide semiconductor layer crosses a plane where the first insulating layer is in contact with the oxide semiconductor layer and a plane where the second insulating layer is in contact with the oxide semiconductor layer, and
   wherein the oxide semiconductor layer is thinner than the first insulating layer and the second insulating layer.

2. The semiconductor device according to claim 1,
   wherein a crystal orientation of a crystal part in the channel formation region is different from that of the one of the pair of n-type regions, and
   wherein the crystal orientation of the crystal part in the channel formation region is different from that of the other of the pair of n-type regions.

3. The semiconductor device according to claim 2,
   wherein each c-axis of the crystal parts is aligned in a direction parallel to a normal vector of a surface where the oxide semiconductor layer is formed.

4. The semiconductor device according to claim 1,
   wherein the oxide semiconductor layer includes In, Zn, and at least one of Al, Ga, Ge, Y, Zr, Sn, La, Ce, and Hf.

5. The semiconductor device according to claim 1,
   wherein the oxide semiconductor layer includes In, Zn and Ga.

6. The semiconductor device according to claim 1,
   wherein a side surface of the source electrode layer is aligned with a side surface of the first insulating layer, and a side surface of the drain electrode layer is aligned with a side surface of the second insulating layer.

7. A display device comprising the semiconductor device according to claim 1.

8. A method for manufacturing a semiconductor device, comprising the steps of:
   forming a gate insulating layer over a gate electrode layer;
   forming a first insulating layer and a second insulating layer over the gate insulating layer;
   forming an oxide semiconductor layer including a crystal part over the gate insulating layer, the first insulating layer, and the second insulating layer; and
   forming a source electrode layer over the first insulating layer and the oxide semiconductor layer, and forming a drain electrode layer over the second insulating layer and the oxide semiconductor layer,
   wherein the oxide semiconductor layer includes a channel formation region and a pair of n-type regions, wherein one of the pair of n-type regions is in contact with a top surface and a side surface of the first insulating layer, wherein the other of the pair of n-type regions is in contact with a top surface and a side surface of the second insulating layer, wherein the channel formation region is in contact with the gate insulating layer, wherein a plane where the gate insulating layer is in contact with the oxide semiconductor layer crosses a plane where the first insulating layer is in contact with the oxide semiconductor layer and a plane where the second insulating layer is in contact with the oxide semiconductor layer, and wherein the oxide semiconductor layer is thinner than the first insulating layer and the second insulating layer.

9. The method for manufacturing a semiconductor device according to claim 8, wherein a side surface of the source electrode layer is aligned with a side surface of the first insulating layer, and a side surface of the drain electrode layer is aligned with a side surface of the second insulating layer.

\* \* \* \* \*